(12) United States Patent
Heim et al.

(10) Patent No.: US 10,277,203 B2
(45) Date of Patent: Apr. 30, 2019

(54) DIGITAL FILTER WITH CONFIDENCE INPUT

(71) Applicant: Microchip Technology Germany GmbH, Rosenheim (DE)

(72) Inventors: Axel Heim, Munich (DE); Martin Hoch, Gilching (DE)

(73) Assignee: MICROCHIP TECHNOLOGY GERMANY GMBH, Rosenheim (DE)

( * ) Notice: Subject to any disclaimer, the term of this patent is extended or adjusted under 35 U.S.C. 154(b) by 261 days.

(21) Appl. No.: 15/215,930

(22) Filed: Jul. 21, 2016

(65) Prior Publication Data

US 2017/0040977 A1 Feb. 9, 2017

Related U.S. Application Data

(63) Continuation-in-part of application No. 15/053,722, filed on Feb. 25, 2016.

(60) Provisional application No. 62/127,011, filed on Mar. 2, 2015, provisional application No. 62/121,953, filed on Feb. 27, 2015.

(51) Int. Cl.
*H03H 17/06* (2006.01)
(52) U.S. Cl.
CPC .................... *H03H 17/06* (2013.01)
(58) Field of Classification Search
None
See application file for complete search history.

(56) References Cited

U.S. PATENT DOCUMENTS

| | | | | |
|---|---|---|---|---|
| 5,231,680 | A | 7/1993 | Williams | 382/261 |
| 5,537,443 | A * | 7/1996 | Yoshino | H04B 1/123 375/340 |
| 6,175,591 | B1 | 1/2001 | Iwamatsu | 375/232 |
| 6,856,703 | B1 | 2/2005 | Gobert | 382/260 |
| 7,796,708 | B2 * | 9/2010 | Yehudai | H04L 27/38 375/143 |
| 8,671,128 | B1 * | 3/2014 | Dehghan | H03H 17/0292 375/232 |
| 2011/0274366 | A1 | 11/2011 | Tardif | 382/260 |

FOREIGN PATENT DOCUMENTS

EP   2851867 A2   3/2015   ............. G06T 5/20

OTHER PUBLICATIONS

Grubbs, F. E., "Sample Criteria for Testing Outlying Observations," Annals of Mathematical Statistics, pp. 27-58, Mar. 1950.
(Continued)

*Primary Examiner* — Michael D. Yaary
(74) *Attorney, Agent, or Firm* — Slayden Grubert Beard PLLC

(57) ABSTRACT

A digital filter has an assigned filter function with assigned filter coefficients, an input receiving input samples, another input receiving confidence values, and an output. Each input sample value is associated to an input confidence value, wherein the filter output depends on the input samples, the input confidence values as well as the filter coefficients. The filter contains multiple accumulators, wherein an output sample is produced after a predetermined number of sample values wherein associated confidence values have been input to the filter.

38 Claims, 18 Drawing Sheets

(56) References Cited

OTHER PUBLICATIONS

Kalman, R. E., "A New Approach to Linear Filtering and Prediction Problems," Transactions of the ASME—Journal of Basic Engineering, 12 pages, 1960.

Hampel, F. R., "The Influence Curve and its Role in Robust Estimation," Journal of the American Statistical Association, vol. 69, No. 46, pp. 383-393, 1974.

Blahut, R. E., *Theory and Practice of Error Control Codes*, Entire Book, AddisonWesley, Book Review, 2 pages, 1983.

Lee, J.-S., "Digital image smoothing and the sigma filter," Computer Vision, Graphics, and Image Processing, pp. 165-168, 1983.

Ko, S.J. et al., "Center Weighted Median Filters and Their Applications to Image Enhancement," IEEE Transactions on Circuits and Systems, vol. 38, No. 9, pp. 984-993, 1991.

Hwang, H. et al., "Adaptive Median Filters: New Algorithms and Results," IEEE Transactions on Image Processing, vol. 4, No. 4, pp. 499-502, 1995.

Bossert, M., *Channel Coding for Telecommunication*, Entire Book, New York, NY, USA: John Wiley & Sons, Inc., Book Abstract, 2 pages, 1999.

Boashash, Boualem et al., Signal Enhancement by Time-Frequency Peak Filtering. IEEE Transactions on Signals Processing, vol. 52, No. 4, pp. 929-937 (9 pages), Apr. 2004.

Bohn, Bruce, "AN1250: Micrcohip CTMU for Capacitive Touch Applications," Microchip Technology Incorporated, 22 pages, Jan. 16, 2009.

Aiswarya, K., "A New and Efficient Algorithm for the Removal of High Density Salt and Pepper Noise in Images and Videos," Second International Conference on Computer Modeling and Simulation, pp. 409-413, 2010.

Davison, Burke, "AN1478: mTouch™ Sensing Solution Acquisition Methods Capacitive Voltage Divider," Microchip Technology Incorporated, 28 pages, Oct. 26, 2012.

Benazir, T. et al., "Removal of High and Low Density Impulse Noise from Digital Images Using Non Linear Filter," International Conference on Signal Processing, Image Processing and Pattern Recognition, 7 pages, 2013.

Horentrup, J. et al., "Confidence-aware guided image filter," IEEE International Conference on Image Processing, pp. 3243-3247, 2014.

"MGC3030/3130: 3D Tracking and Gesture Controller Data Sheet," Microchip Techology Incorporated, 50 pages, Mar. 25, 2014.

"Microchip Touch and Input Sensing Solutions," Retrieved from http://www.microchip.com/touchandinputsensing, 2 pages, Retrieved on Mar. 14, 2016.

Commission I.E. "IEC 61000-4-4: Electrical Fast Transient/Burst Immunity Test," 3 pages, Retrieved on Mar. 14, 2016.

International Search Report and Written Opinion, Application No. PCT/EP2016/054181, 15 pages, dated May 20, 2016.

U.S. Final Office Action, U.S. Appl. No. 15/053,722, 11 pages, dated Jan. 10, 2018.

Yue, Qi et al., "Low-Power FIR Filter Based on Standard Cell," 6th International Conference on ASIC, Shanghai, China, IEEE, vol. 1, pp. 251-254, Oct. 24, 2005.

International Search Report and Written Opinion, Application No. PCT/EP2017/068172, 17 pages, dated Nov. 16, 2017.

\* cited by examiner ized signal, exploiting the information's redundancy. Examples for such devices include capacitive-touch sensing or touchless position and gesture sensing systems, digital voltmeters, thermometers or pressure sensors.

DIGITAL FILTER WITH CONFIDENCE INPUT

CROSS-REFERENCE TO RELATED APPLICATIONS

This application is a Continuation-In-Part of U.S. patent application Ser. No. 15/053,722 filed on Feb. 25, 2016, which claims priority to commonly owned U.S. Provisional Patent Application No. 62/121,953 filed Feb. 27, 2015 and U.S. Provisional Patent Application No. 62/127,011 filed Mar. 2, 2015; all of which are hereby incorporated by reference herein for all purposes.

TECHNICAL FIELD

The present disclosure relates to digital filters, in particular digital filters for noise suppression.

BACKGROUND

To sense analog signals for processing in digital devices, sampling a signal (significantly) faster than its actual information content changes is a common practice that allows the enhancement of the digitized signal, exploiting the information's redundancy. Examples for such devices include capacitive-touch sensing or touchless position and gesture sensing systems, digital voltmeters, thermometers or pressure sensors.

Exemplary capacitive sensing systems which can be subject to significant noise include the systems described in application note AN1478, "mTouch™ Sensing Solution Acquisition Methods Capacitive Voltage Divider", and AN1250, "Microchip CTMU for Capacitive Touch Applications", both available from Microchip Technology Inc., the Assignee of the present application, and hereby incorporated by reference in their entirety.

Another exemplary application is a touchless capacitive 3D gesture system—also known as the GestIC® Technology—manufactured by the Assignee of the present application.

The sensor signals are typically subject to disturbance by various noise types, such as broadband noise, harmonic noise, and peak-noise. The latter two can arise, for example, from switching power supplies, and are also addressed in electro-magnetic immunity standard tests, e.g. IEC 61000-4-4.

The signal acquisition can also be interrupted in a scheduled or deterministic scheme; e.g., when multiplexing several sensors in time, or by irregular events such as data transmission failures. Such discontinuities or missing samples can cause undesired phase jumps in the signal. With digital filters designed for regular sampling intervals, this will corrupt the filter timing and can severely affect their noise-suppression performance.

In analogy to erased messages in the context of channel coding in digital communications (Blahut, 1983; Bossert, 1999) we refer to missing samples and samples that do not carry useful information—e.g., due to peak noise—as Erasures.

FIG. 1a shows a system 100 performing a basic procedure for estimating a noisy, real-valued baseband signal. The Analog-to-Digital Converter (ADC) 110 samples the signal at a rate (significantly) higher than its information changes. The digital signal is then input to a low-pass filter 120 and decimated with rate R by decimator 130. The downsampled result is processed further or is simply displayed, e.g. on a numeric display 140 as shown in FIG. 1a. Therein, the low-pass filter 120 is able to attenuate the higher frequency components of broadband noise, but will not thoroughly suppress noise peaks.

The problem of peak-noise suppression occurs in many applications, such as image processing (T. Benazir, 2013), seismology, and medical (B. Boashash, 2004). A standard approach for fighting peak noise is to apply a Median Filter or variants.

An approach to suppress peak-noise, but still smoothing the input signal, is a filter that averages over a subset of samples in a time window, excluding samples that have been identified as noise peaks or outliers, or excluding, for example, the n largest and the n smallest samples (Selective Arithmetic Mean (SAM) Filter or 'Sigma Filter' (Lee, 1983)). Clearly the SAM filter is a time-varying filter with a Finite Impulse Response (FIR) that adapts to the time-domain characteristics of its input signal.

However, while superior in the presence of noise peaks (i.e. with Erasures), without peaks the noise-suppression characteristics of such a SAM averaging filter is inferior to other state-of-the-art filters that, for example, use a Hamming window as impulse response, or filters whose frequency response is designed using the Least Squares method, as shown in FIG. 1b for a window length of 32 samples. In terms of the filters' magnitude responses, the solid curve of the Least-Squares filter and the dashed curve of the Hamming filter show improved side-lobe attenuation, compared to an averaging filter with rectangular impulse response (dash-dotted curve).

SUMMARY

There exists a need for an improved method and system of processing signals that are subject to noise. The present application is not restricted to any of the above described sensor systems but may be applied to any type of signal that is subject to noise and requires evaluation.

According to an embodiment, a digital filter may comprise an assigned filter function with assigned filter coefficients, an input receiving input samples, another input receiving confidence values, and an output, wherein each input sample value is associated to an input confidence value and wherein each input sample is weighted with its associated confidence value, wherein the filter output depends on both the input samples and the input confidence values, and wherein the filter comprises accumulators configured to accumulate a predefined number the confidence weighted input samples, the associated confidence values, the confidence values weighted with assigned filter coefficients, and the confidence weighted input samples further weighted with the assigned filter coefficients.

According to a further embodiment the filter may comprising a first branch having a first accumulator receiving the input confidence values weighted with coefficients from a coefficient set and generating a first accumulated value; a second branch having a second accumulator receiving the input confidence values and generating a second accumulated value; a third branch having a third accumulator receiving input sample values weighted with coefficients from the coefficient set and the input confidence values and generating a third accumulated value; and a fourth branch having a fourth accumulator receiving the confidence weighted input values and generating a fourth accumulated value. According to a further embodiment, the first accumulated value is subtracted from a constant value, wherein a result of the subtraction is being divided by the second accumulated value and multiplied with the fourth accumulated value, and added to the third accumulated value, and wherein the first, second, third, and fourth accumulator are subsequently cleared.

According to another embodiment, a digital filter may comprise an assigned filter function with first and second filter coefficient sets, an input receiving input samples, another input receiving confidence values, and an output, wherein each input sample value is associated to an input confidence value; the filter output depends on both the input samples and the input confidence values, and wherein the digital filter comprises a first branch having a first accumulator receiving the input confidence values weighted with coefficients from the first coefficient set and generating a first accumulated value; a second branch having a second accumulator receiving the input confidence values weighted with coefficients from the second coefficient set and generating a second accumulated value; a third branch having a third accumulator receiving input sample values weighted with coefficients from the first coefficient set and the input confidence values and generating a third accumulated value; and a fourth branch having a fourth accumulator receiving the input values weighted with coefficients from the second coefficient set and the input confidence values and generating a fourth accumulated value.

According to a further embodiment of the above digital filter, the first accumulated value is subtracted from a constant value, wherein a result of the subtraction is being divided by the second accumulated value and multiplied with the fourth accumulated value, and added to the third accumulated value, and wherein the first, second, third, and fourth accumulator are subsequently cleared.

According to a further embodiment of any of the above digital filter, multiple instances of the filter are operated in parallel, each instance on a subset of input samples and associated confidence values, and with dedicated coefficients. According to a further embodiment of any of the above digital filter, a confidence value is represented by a digital logic value. According to a further embodiment of any of the above digital filter, the constant value is a sum of all coefficients. According to a further embodiment of any of the above digital filter, the assigned filter function is a low-pass filter function. According to a further embodiment of any of the above digital filter, the low-pass has been obtained from transforming a high-pass or band-pass to an equivalent low-pass domain. According to a further embodiment of any of the above digital filter, the assigned filter function has only positive valued coefficients or only negative valued coefficients. According to a further embodiment of any of the above digital filter, the assigned filter function has at least one non-zero valued coefficient with a different magnitude than another non-zero coefficients. According to a further embodiment of any of the above digital filter, a digital filter's DC gain is constant or approximately constant.

According to yet another embodiment, a filter system may comprise a first and second digital filter, each comprising an assigned filter function with assigned filter coefficients, an input receiving input samples, another input receiving confidence values, and an output, wherein each input sample value is associated to an input confidence value and wherein each input sample is weighted with its associated confidence value; wherein the filter output depends on both the input samples and the input confidence values, and wherein the filter comprises accumulators configured to accumulate the confidence weighted input samples, the associated confidence values, the confidence values weighted with assigned filter coefficients, and the confidence weighted input samples further weighted with the assigned filter coefficients; and a demultiplexer receiving an input signal and generating input samples for said first and second digital filter.

According to a further embodiment of the filter system, the system may further comprise a first outlier detector receiving said input samples for said first digital filter and generating associated confidence values; and a second outlier detector receiving said input samples for said second digital filter and generating associated confidence values. According to a further embodiment of the filter system, input samples for the first digital filter are high samples and input samples for the second digital filter are low samples.

According to yet another embodiment, a filter system may comprise a first and second digital filter, each comprising an assigned filter function with first and second filter coefficient sets, an input receiving input samples, another input receiving confidence values, and an output, wherein each input sample value is associated to an input confidence value; the filter output depends on both the input samples and the input confidence values, and wherein each of the digital filter further comprises a first branch having a first accumulator receiving the input confidence values weighted with coefficients from the first coefficient set and generating a first accumulated value; a second branch having a second accumulator receiving the input confidence values weighted with coefficients from the second coefficient set and generating a second accumulated value; a third branch having a third accumulator receiving input sample values weighted with coefficients from the first coefficient set and the input confidence values and generating a third accumulated value; and a fourth branch having a fourth accumulator receiving the input values weighted with coefficients from the second coefficient set and the input confidence values and generating a fourth accumulated value; and wherein the system further comprises a demultiplexer receiving an input signal and generating input samples for said first and second digital filter.

According to a further embodiment of the above filter system, the system may further comprise a first outlier detector receiving said input samples for said first digital filter and generating associated confidence values; and a second outlier detector receiving said input samples for said second digital filter and generating associated confidence values. According to a further embodiment of the above filter system, input samples for the first digital filter are high samples and input samples for the second digital filter are low samples.

According to yet another embodiment, a digital filter may comprise an assigned filter function with assigned filter coefficients, an input receiving input samples, another input receiving confidence values, and an output, wherein each input sample value is associated to an input confidence value; wherein the filter output depends on the input samples, the input confidence values as well as the filter coefficients; wherein the filter contains multiple accumulators; wherein an output sample is produced after a predetermined number of sample values wherein associated confidence values have been input to the filter.

According to yet another embodiment, a method for filtering digital input samples, may comprise the steps of: receiving digital input sample values and associated input confidence values; accumulating the input confidence values weighted with coefficients from a coefficient set and generating a first accumulated value; accumulating the input confidence values and generating a second accumulated value; accumulating the input sample values weighted with coefficients from the coefficient set and the input confidence values and generating a third accumulated value; accumulating the confidence weighted input values and generating a fourth accumulated value.

According to a further embodiment of the method, the method may further comprise subtracting the first accumulated value from a constant value, wherein a result of the subtraction is being divided by the second accumulated value and multiplied with the fourth accumulated value, and added to the third accumulated value, and subsequently clearing the first, second, third, and fourth accumulator. According to a further embodiment of the method, the constant value is a sum of all coefficients. According to a further embodiment of the method, the input confidence value is binary.

According to yet another embodiment, a method for filtering digital input samples, may comprise the steps of: receiving digital input sample values and associated input confidence values; accumulating the input confidence values weighted with coefficients from a first coefficient set and generating a first accumulated value; accumulating the input confidence values weighted with coefficients from a second coefficient set and generating a second accumulated value; accumulating input sample values weighted with coefficients from the first coefficient set and the input confidence values and generating a third accumulated value; and accumulating the input values weighted with coefficients from the second coefficient set and the input confidence values and generating a fourth accumulated value.

According to a further embodiment of the method, the method may further comprise subtracting the first accumulated value from a constant value, wherein a result of the subtraction is being divided by the second accumulated value and multiplied with the fourth accumulated value, and added to the third accumulated value, and subsequently clearing the first, second, third, and fourth accumulator. According to a further embodiment of the method, the constant value is a sum of all coefficients. According to a further embodiment of the method, the input confidence value is binary.

DETAILED DESCRIPTION

Figure 11:
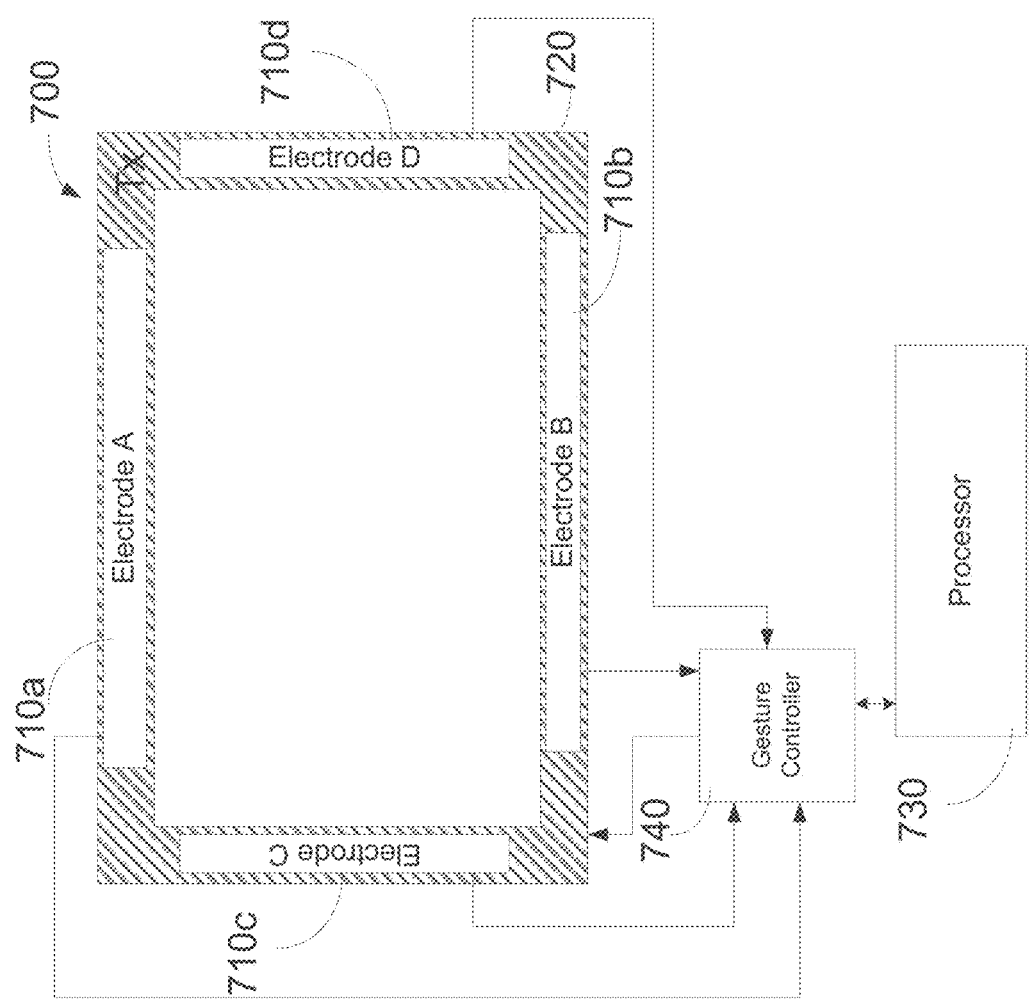
FIG. 11 shows an embodiment of a non-touching gesture detection system using an alternating quasi-static electric field.

According to various embodiments, a reliable estimate of a real-valued baseband signal, e.g. a demodulated and down-sampled GestIC® signal, can be obtained where the input signal is oversampled and noisy. GestIC® devices, such as MGC3030 or MGC3130 or newer designs are available from the Assignee of the present application. For example, FIG. 11 shows a typical embodiment, wherein controller 740 represents the GestIC® device. A general description and design guide such as the "GestIC® Design Guide" published online Jan. 15, 2015 is available from Microchip Technology Inc. and hereby incorporated by reference.

The 3D-gesture detection system 700 shown in FIG. 11 provides for a transmission electrode 720 which may be formed by a frame structure as shown in FIG. 11 and a plurality of receiving electrodes 710a . . . d. However, the entire rectangular area under the receiving electrodes 710a . . . d may be used as a transmission electrode or such an electrode can also be split into a plurality of transmission electrodes. The transmission electrode(s) 720 generate an alternating electrical field. A gesture controller 740 receives signals from the receiving electrodes 710a . . . d which may represent the capacitances between the receive electrodes 710a . . . d and system ground and/or the transmission electrode 720. The gesture controller 740 may evaluate the signals and provide a processing system 730 with human device input information. This information may be 3D moving coordinates similar to the 2-D moving information generated by a computer mouse and/or include commands that are generated from detected gestures.

The problem that was faced in such an application was that the noise that is introduced to the sensor signals is both broad-band and peak-noise, for which no state-of-the-art approach was known to address both issues simultaneously. Also, in a GestIC® application as well as other applications it is possible that some samples of the input signal are lost or cannot be generated for various reasons. While the negative impact of input noise is obvious, irregularities in the input sampling intervals lead to corruption of the filter timing and severely affect the noise suppression performance. Digital filters are typically designed for regular sampling intervals, and anything other than that leads—from the filter's point of view—to undesired phase jumps in the input signal. The position of noise peaks and missing samples in the signal is determined by some other means, e.g. a peak-noise detection system, or a deterministic noise indicator. As mentioned above, there is a standard approach for fighting broad-band noise, namely applying a frequency (low pass) filter. And there is another standard approach for fighting peak noise, namely applying a median filter over a window of signal samples.

While such problems are particularly relevant in a GestIC® system, as mentioned above, these scenarios may not only apply to GestIC® systems, but may also be relevant to other sensor systems. Hence, the proposed measures may apply to various signal sources.

For the proposed filtering method, each input sample is associated with a confidence value. This confidence value is indicating whether the associated sample is an Erasure or not—i.e., whether or not it is an actually missing sample or a sample that is known to not carry useful information. The confidence values are assumed to be known by some other means. Such means can include, for example, deterministic input, or Outlier Detection methods such as the Grubbs' Test (Grubbs, 1950), the Generalized Extreme Studentized Deviate (GESD) test, or the Hampel identifier (Hampel, 1974). In the context of image processing, confidence values are used—for example—as weights in a Least Squares regression for improved alpha matting (J. Horentrup, 2014).

Figure 2:
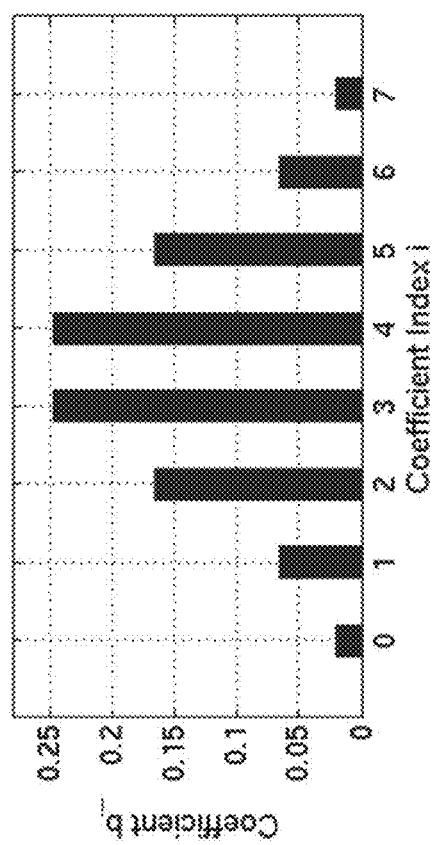
FIG. 2 shows typical tap weights of a low pass filter with finite impulse response.
Figure 2:
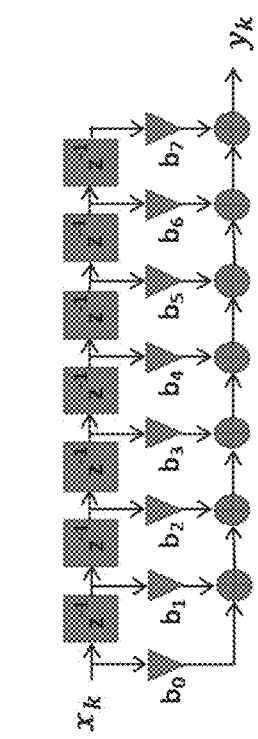

According to various embodiments, the following should be observed in order to both suppress broad-band noise and to ignore undesired, e.g. noisy or missing, samples—for which no state-of-the-art approach was known to address both issues simultaneously:

1. Erasures (e.g. detected noise peaks) must not contribute to the filter output;
2. Constant filter gain should be provided at DC (For a constant input signal, the filter output signal level must be constant, too.);
3. Gradual adaptation to the number of Erasures should be provided, while preserving the default filter characteristics when there are no Erasures FIG. 2 shows the filter coefficients of a typical low-pass filter—or 'windowing'—function, here exemplary a normalized Hamming window of length 8. Each filter coefficient defines the weight of its associated tap in a tapped delay line implementation, also shown in FIG. 2, where each tap is aligned underneath its associated coefficient in the bar plot. Therefore, we use the terms 'filter coefficient' and 'tap weight' synonymously. In this example, the tapped delay line contains 7 consecutive delay stages $z^{-1}$ and 8 tap weights. Exemplary input samples are also shown in FIG. 2. Other sample structures may apply with less or more stages.

According to various embodiments, given a filter function and an input signal with confidence information for each sample, the weight of the filter taps corresponding to input samples with less confidence is reduced while maintaining the filter's DC gain. FIG. 2 shows a typical weight/coefficient distribution of a low pass filter which in this example is formed by, e.g., seven consecutive delay stages $z^{-1}$. Other sample structures may apply with less or more stages.

In the following input samples that do not carry any useful information and, equivalently, missing samples can be considered as Erasures, and corresponding samples are said to have Zero confidence. The information whether a sample is erased or not is assumed to be known from any other source or algorithm, e.g. by comparing samples to a threshold. The respective digital filter's impulse response will be referred to as 'filter function'.

Figure 3:
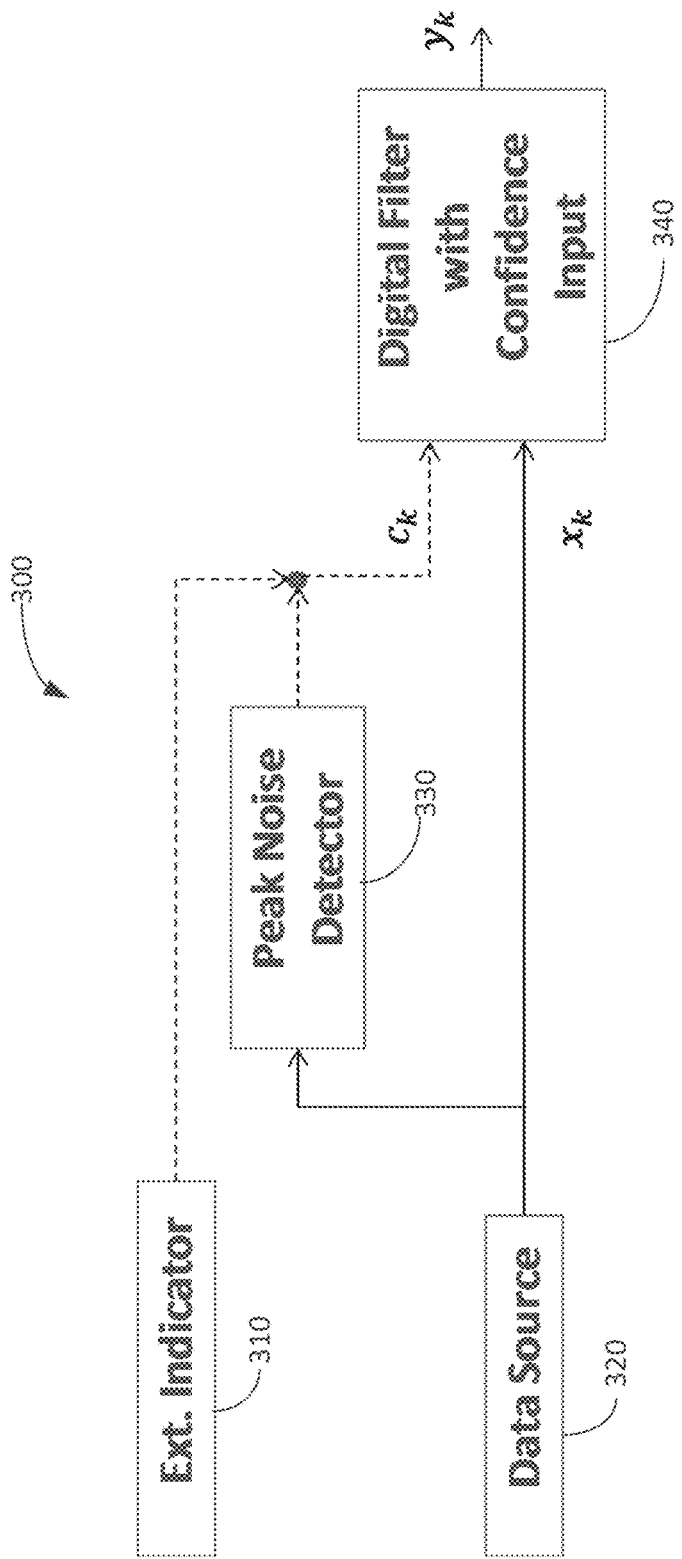
FIG. 3 shows an exemplary block diagram of a data source and associated confidence generation as an input source for a digital filter.

FIG. 3 shows a block diagram of an exemplary Digital Filter with Confidence Input 300 and its input signal sources. The Data Source 320 is generating the signal x with samples $x_k$ at discrete time k. The signal x is input to a peak noise (or 'outlier') detector 330 which classifies each sample $x_k$ into 'not noisy' or 'noisy' by associating a confidence value $c_k$ to $x_k$, where for example $c_k=1$ means 'not noisy' or 'full confidence in $x_k$', and $c_k=0$ means 'noisy' or 'No confidence in $x_k$'. That is, a sample $x_k$ with associated $c_k=0$ is an Erasure. According to other embodiments, the confidence information can also origin from some external means which we refer to as External Indicator 310. This external indication can be seen as a deterministic confidence input.

Figure 5:
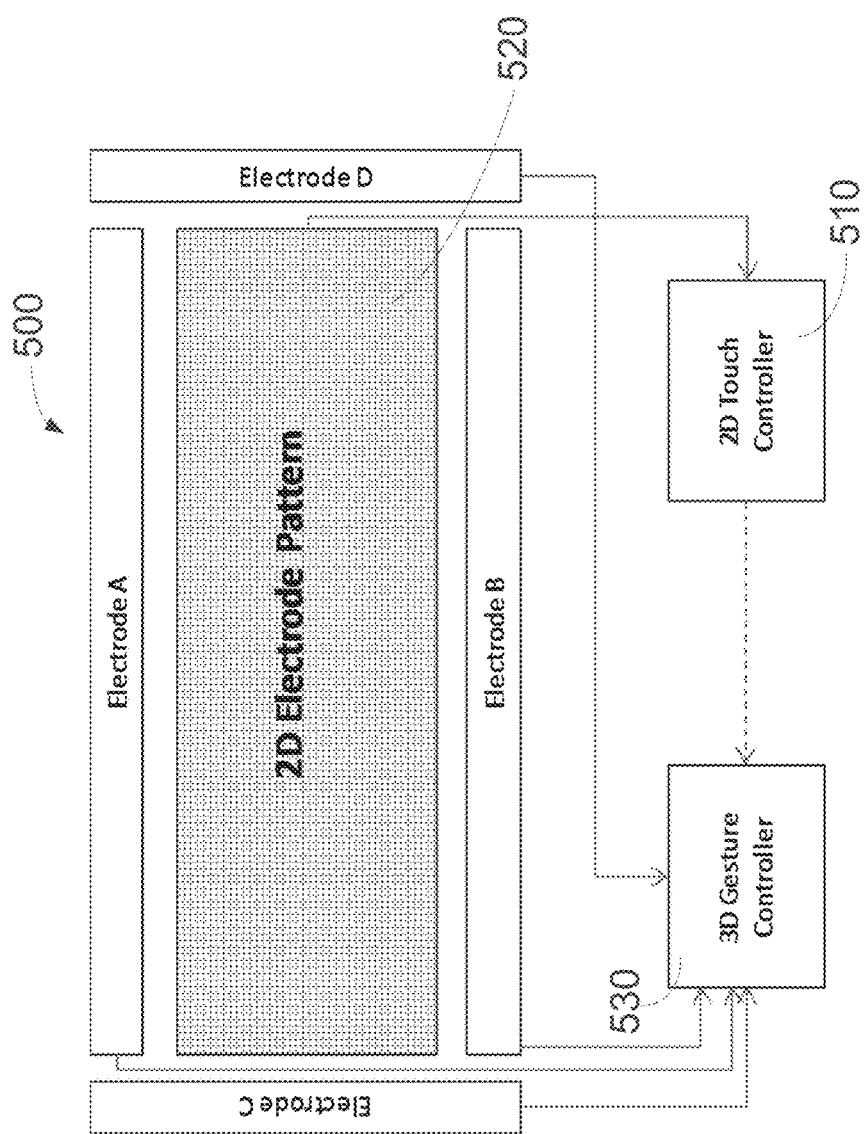
FIG. 5 shows a system with an external confidence generating controller.

FIG. 5 shows a system 500 with a 2D capacitive touch detection and finger tracking system, as it is for example used in touch panels or touch displays, consisting of number of sensor electrodes "2D Electrode Pattern" 520 and a controller unit "2D Touch Controller" 510. Around the 2D Electrode Pattern are arranged four further electrodes A, B, C, D used with a 3D Gesture Controller 530 to form a capacitive 3D gesture detection system. When the 2D touch detection system 510, 520 is active, it is interfering the received signals of the 3D gesture detection system, i.e. the received data of the 3D gesture detection system is noisy and unusable. In order to yield a functional 2D-3D capacitive sensor system 500, the 2D touch controller 510 is active only occasionally when no touch is detected, and while it is active, this is signaled to the 3D Gesture Controller 530 (dashed arrow), which then knows that its current received values are noisy and are associated Zero confidence. That is, the External Indicator can set $c_k=0$ when sample $x_k$ is generated while the 2D system 510, 520 was interfering the received signal, and $c_k=1$ else. $x_k$ and $c_k$ are input to the Digital Filter with Confidence Input within the 3D Gesture Controller 530.

An example for a simple peak-noise detector, or outlier detector, is the following: At each time k, compute the average $\mu_k := \sum_{i=1}^{M} x_{k-i}$ and the standard deviation $\sigma_k := \sqrt{\sum_{i=1}^{M}(x_{k-i}-\mu_k)^2}$ of the last M samples $x_{k-1}, x_{k-2}, \ldots, x_{k-M}$. If $|x_k| > \mu_k + 3 \cdot \sigma_k$, set $c_k=0$, else $c_k=1$.

1. Principal Approach

A standard digital finite input response (FIR) filter of order N is considered with time-invariant filter function $b=[b_0; b_1; \ldots; b_N]$, where $b_i$, $i=0, 1, \ldots N$ are the filter coefficients. For a given input signal x with samples $x_k$, the filter output signal y is $$y_k = \sum_{i=0}^{N} b_i \cdot x_{k-i}, \quad (1.1)$$

wherein k is the discrete time index. The sum of all filter coefficients $b_i$ is the direct current (DC) filter gain. For simplicity and without loss of generality, in the following we assume $$\sum_{i=0}^{N} b_i = 1,$$

With each input sample $x_k$ we assume we are provided with an associated confidence value $c_k$. At first, we assume that the confidence value is binary with $c_k \in \{0; 1\}$, where $c_k=0$ means 'no confidence into sample $x_k$', and $c_k=1$ means 'full confidence'. From the time-invariant filter function b with coefficients $b_i$ we will compute time-variant filter function w(k) with coefficients $w_i(k)$ which depend on the confidence values $c_k$. When the latest N+1 input samples have all been with full confidence, i.e. $c_{k-i}=1$ for i=0, . . . , N, we desire that filter function w(k) is equal to function b. If, however, there is one or more Erasures, i.e. input samples $x_{k-i}$ with associated $c_{k-i}=0$, then $x_{k-i}$ must not contribute to the output value $y_k$.

This is achieved by multiplying each filter coefficient $b_i$ in (1.1) with the confidence value $c_{k-i}$ of its associated input sample $x_{k-i}$. However, with the modified filter coefficients $b_i'(k):=b_i \cdot c_{k-i}$, the DC filter gain $\Sigma_{i=0}^{N} b_i'(k)$ is no longer guaranteed to be constant.

Consequently, the erased filter weight must be distributed onto the other filter coefficients. The preferred approach to do so is to distribute the erased weight $$\sum_{j=0:\,c_{k-j}=0}^{N} b_j = \sum_{j=0}^{N}(1-c_{k-j})\cdot b_j$$

evenly onto the remaining $\Sigma_{j=0}^{N} c_{k-j}$ non-erased coefficients, which is yielding a linear time-variant (LTV) filter with coefficients $$w_i(k) := c_{k-i}\cdot b_i + \frac{c_{k-i}}{\sum_{j=0}^{N} c_{k-j}}\cdot \underbrace{\sum_{j=0}^{N}(1-c_{k-j})\cdot b_j}_{\text{erased weight}} \quad (1.2)$$

where $i \in \{0, 1, \ldots , N\}$, and we denote $$\frac{c_{k-i}}{\sum_{j=0}^{N} c_{k-j}}$$

the relative confidence associated to sample $x_{k-i}$ at time k.

This is equivalent to replacing the erased input samples by the average of the non-erased ones at each time instance k, and setting $c_{k-i}=1$ for all i. This way of implementation of the algorithm is particularly interesting for one-time, or 'block-wise' processing of each input sample like it is done with windowing and DC value computation in order to estimate the DC value of a finite set of consecutive samples.

Proof:

$$y_k = \sum_{i=0}^{N} w_i \cdot x_{k-i}$$

$$= \sum_{i=0}^{N} x_{k-i} \cdot \left[ c_{k-i}\cdot b_i + \frac{c_{k-i}}{\sum_{j=0}^{N} c_{k-j}}\cdot \sum_{j=0}^{N}(1-c_{k-j})\cdot b_j \right]$$

-continued $$= \sum_{i=0:\,c_{k-i}=1}^{N} x_{k-i}\cdot b_i + \sum_{i=0:\,c_{k-i}=1}^{N} x_{k-i}\cdot \frac{\sum_{j=0:\,c_{k-j}=0}^{N} b_j}{\sum_{i=0:\,c_{k-i}=1}^{N} 1}$$

$$= \sum_{i=0:\,c_{k-i}=1}^{N} b_i\cdot x_{k-i} + \sum_{i=0:\,c_{k-i}=0}^{N} b_i\cdot \underbrace{\frac{\sum_{j=0:\,c_{k-j}=0}^{N} x_{k-j}}{\sum_{i=0:\,c_{k-i}=1}^{N} 1}}_{\text{average of non-erased input}}.$$

As this procedure implies overwriting the input data, it is not applicable for continuous filtering, where each input sample contributes to multiple output samples, and calculating the output value is done at a rate higher than the input rate divided by the filter length, where we define the filter length as (N+1), i.e. filter order plus 1.

Figure 7:
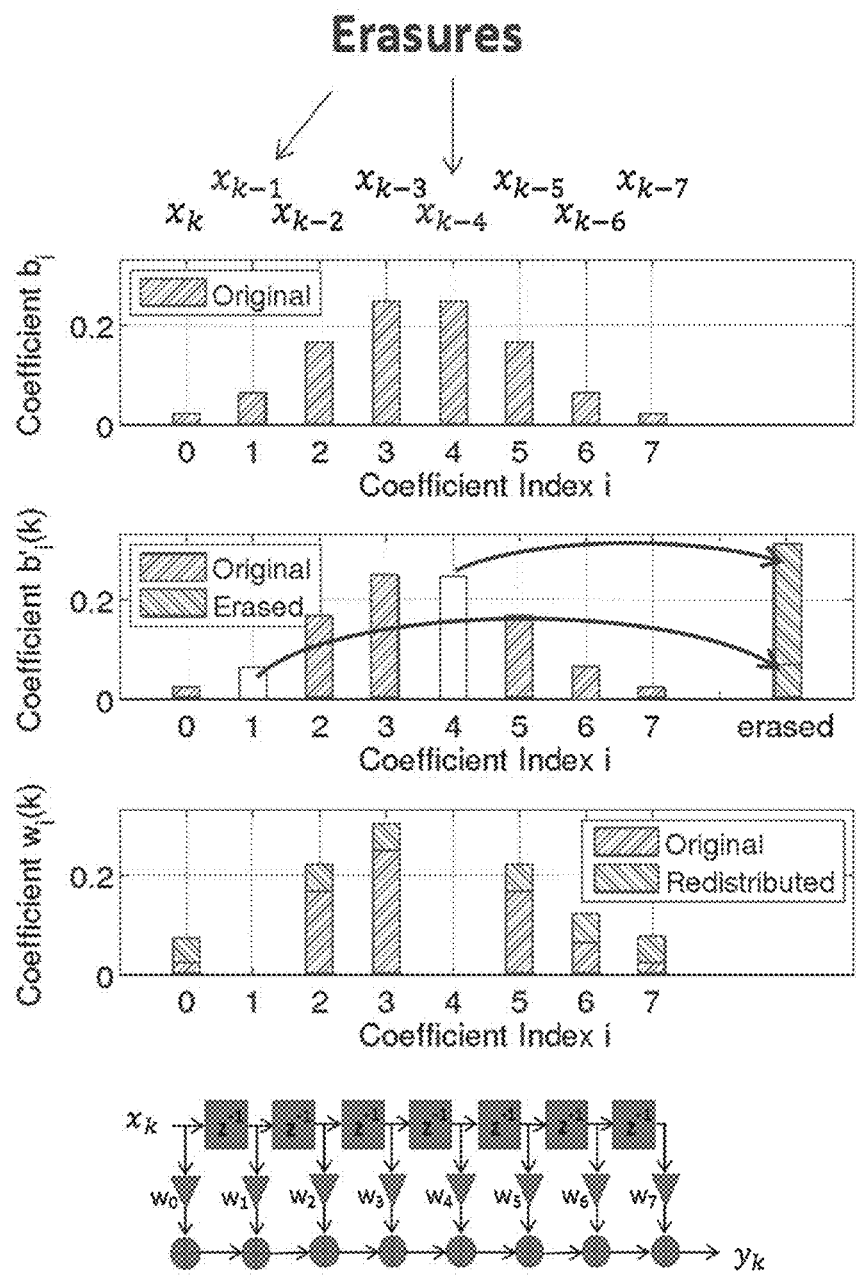
FIG. 7 shows an example of redistribution of erased coefficient weight according to various embodiments.

The re-distribution of erased filter coefficient weight is visualized in FIG. 7. In the very top, the latest 8 input samples at time k are shown, of which $x_{k-4}$ and $x_{k-1}$ are Erasures. The first plot shows the coefficients $b_i$ of the original filter—a Hamming window of length 8—aligned with the shift register implementation in the bottom. In the second plot, the values of the coefficients $b_1'(k)$ and $b_4'(k)$ are set to zero, as the corresponding input samples $x_{k-4}$ and $x_{k-1}$ at time k are Erasures. Also shown is the sum of the erased coefficients on the very right side of the second plot. In the third plot, the erased weight, as shown in the right of the second plot, is evenly re-distributed onto the coefficients assigned to non-erased input samples, yielding $w_i(k)$. The added on weights are shown differently hatched in the third plot. The coefficient weights are shown in the bottom shift register filter diagram as $w_0$-$w_7$ in this embodiment.

With the next input sample at time k+1, the samples and their corresponding confidence information move to the right within the filter's shift register and said redistribution is done again for the shifted pattern of erasures yielding different filter coefficients $w_i(k+1)$.

Figure 8:
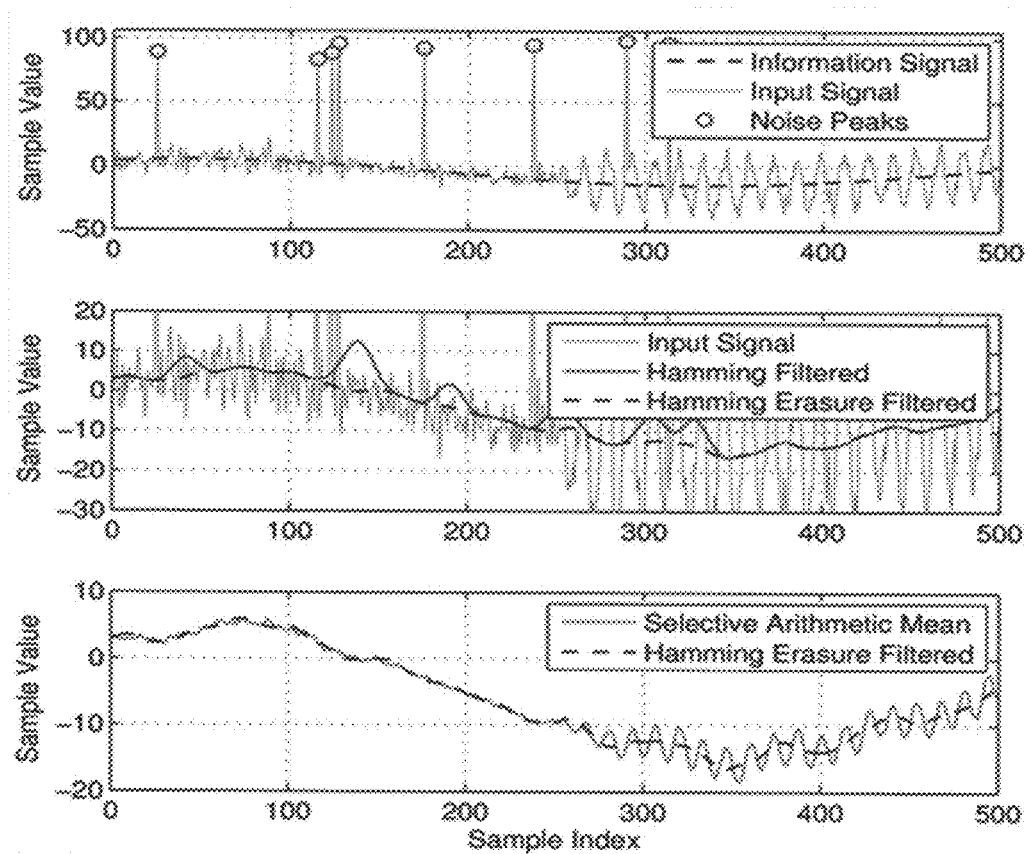
FIG. 8 shows an example of peak-noise suppression performance.

An example for the filter's noise suppression performance is shown in FIG. 8. The top plot shows the filter input signal, which is a slowly varying information signal with additive Gaussian noise, several noise peaks and—starting at sample index 250—with additive 60 Hz sinusoidal noise. The second plot shows that traditional low-pass filtering with a Hamming function of length 64 reduces the higher frequency noise, but only smears the noise peaks that are present in the input signal. However, having identified the noise peaks, they are suppressed completely according to various embodiments. The bottom plot of FIG. 8 demonstrates the benefit of using a Hamming Erasure filter function instead of Moving Average: Compared to simple averaging over non-peak samples, i.e. Selective Arithmetic Mean filtering, the Hamming Erasure filtering yields better suppression of the broad-band noise contained in the input signal, yielding a smoother output.

Figure 9:
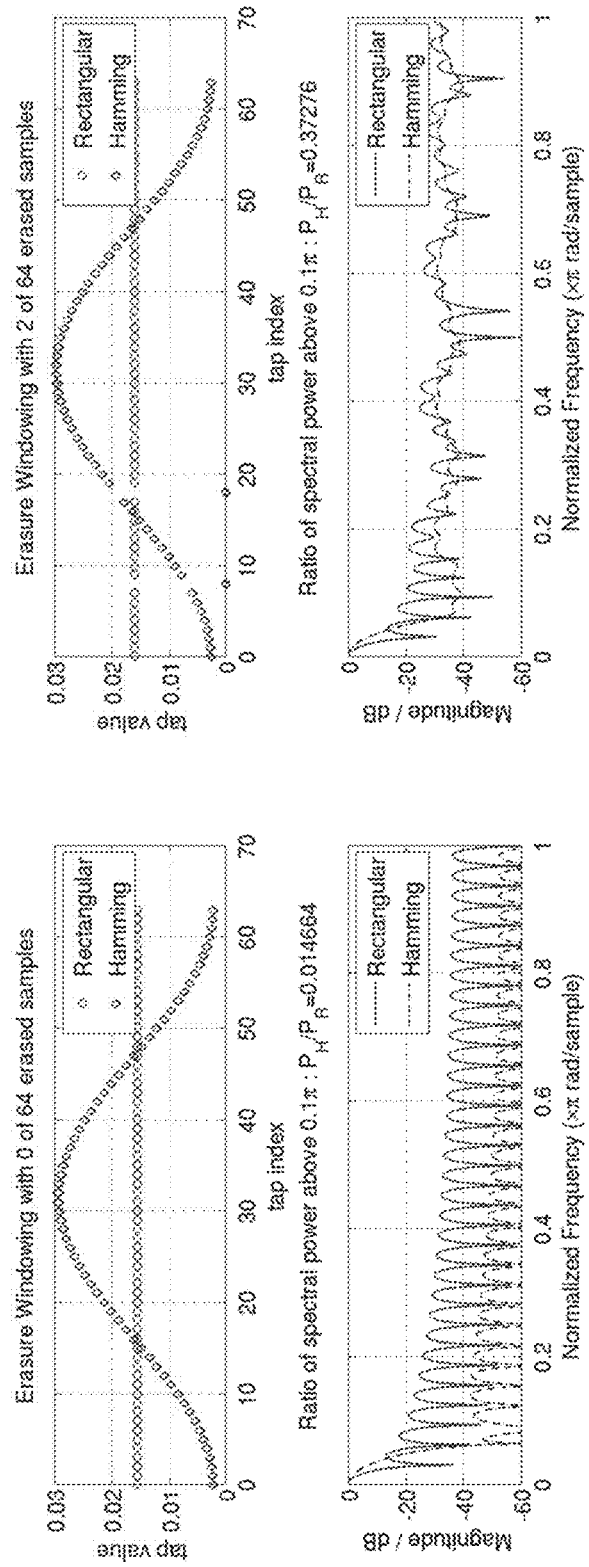
FIG. 9 shows a comparison of filters' coefficients and magnitude spectra with and without erasures.

FIG. 9 illustrates how Erasures affect the filter's frequency response. Here, the left side shows a typical low pass filter using a rectangular window and a Hamming window and its associated magnitude spectrum. On the right side the same filtering using two erased samples is shown. It can be observed that the spectrum of the Hamming Erasure filter is similar to the Rectangular erasure filter—depending on positions of Erasures.

2. Generalizations

2 a) Non-Binary Confidence Input

Up to this point, the confidence input was binary, i.e. the associated input sample was either used for computing the filter output value, or not. However, given above notation it is straight-forward to generalize the confidence input to take real values between 0 and 1, i.e. $c_k \in [0, 1]$, and the larger $c_k$, the more confident we are in the associated sample $x_k$. Apart from the definition of $c_k$, Equation (1.2) remains the same.

2b) General Redistribution Function

For binary confidence input, in Equation (1.2) the erased weight is evenly distributed onto the other coefficients. The two terms in (1.2) can be interpreted as two parallel filter branches whose output is summed-up. The filter function in the first term is computed from b and the confidence input, and the second term is a time-variant averaging filter. The latter can be generalized by introducing another FIR filter function g with coefficients $g_i$, yielding $$w_i(k) = c_{k-i} \cdot b_i + \frac{c_{k-i} \cdot g_i}{\sum_{j=0}^{N} c_{k-j} \cdot g_j} \cdot \sum_{j=0}^{N} (1 - c_{k-j}) \cdot b_j$$

$$w_i(k) = c_{k-i} \cdot \left( b_i + g_i \cdot \frac{\sum_{j=0}^{N}(1 - c_{k-j}) \cdot b_j}{\sum_{j=0}^{N} c_{k-j} \cdot g_j} \right)$$

which is also applicable with non-binary confidence input $c_k \in [0, 1]$. We denote as $$\frac{c_{k-i} \cdot g_i}{\sum_{j=0}^{N} c_{k-j} \cdot g_j}$$

the g-weighted relative confidence associated to sample $x_{k-i}$ at time k.

The filter output hence is given by $$y_k = \sum_{i=0}^{N} w_i(k) \cdot x_{k-i} = \sum_{i=0}^{N} x_{k-i} \cdot c_{k-i} \cdot \left( b_i + g_i \cdot \frac{\sum_{j=0}^{N}(1 - c_{k-j}) \cdot b_j}{\sum_{j=0}^{N} c_{k-j} \cdot g_j} \right).$$

Figure 1A:
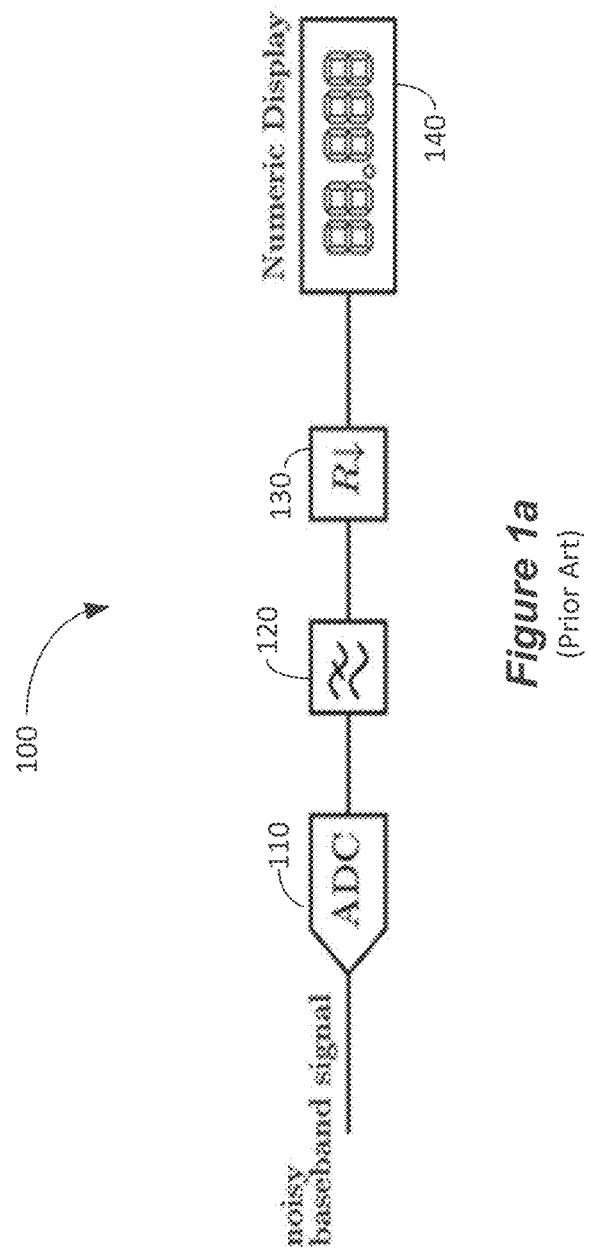
FIG. 1a shows exemplary acquisition of an analog signal, with analog-to-digital conversion and conventional noise suppression.
Figure 1B:
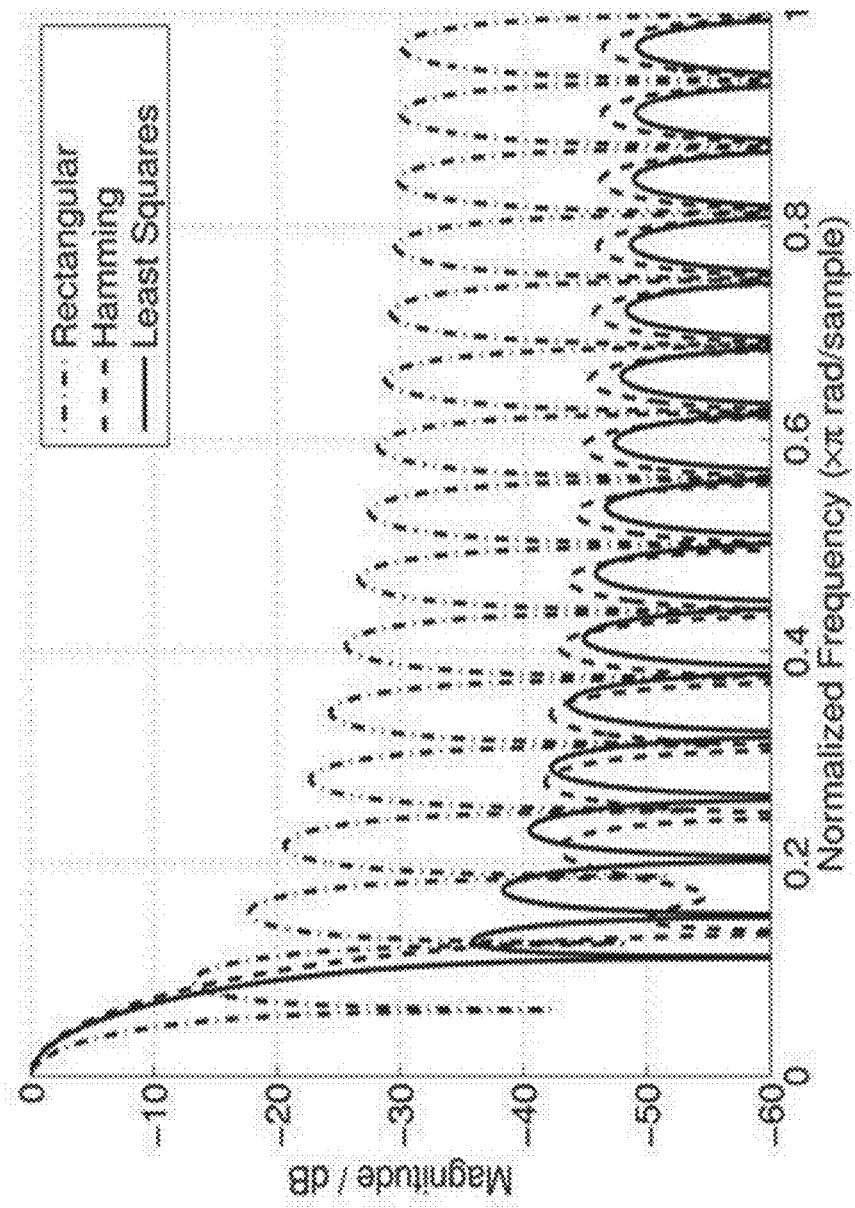
FIG. 1b shows magnitude responses of different low-pass filters.
Figure 4:
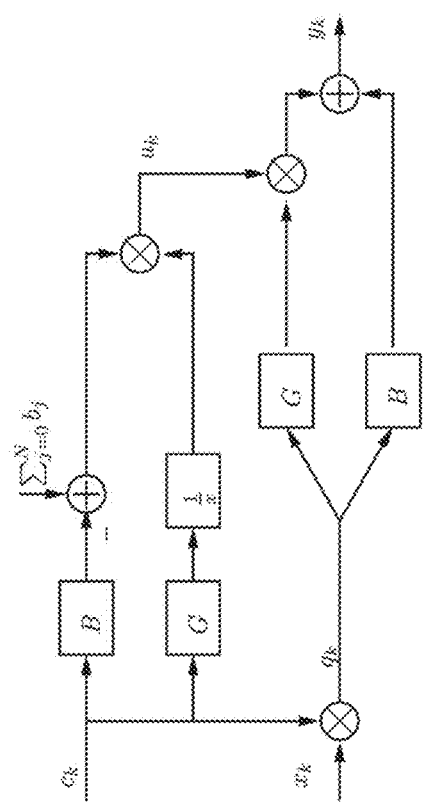
FIG. 4, shows an exemplary implementation of a digital filter with confidence input.

A possible implementation of this filter is shown in FIG. 4, where the block denoted 'B' refers to a standard FIR filter with filter function b, and analog for the block denoted 'G' and filter function g, and the block denoted 1/x refers to the division of 1 by the block's input data, i.e. the output of this block is the multiplicative inverse (reciprocal) of the input. In this implementation, the filter coefficients of the four filter blocks ('B' and 'G') are constant. Of course, the filters 'B' and G' processing the same input data, i.e. $c_k$ or $q_k := x_k \cdot c_k$, can share the same buffer, as it is shown in the shift register implementation in FIG. 6 for filter order N=7, which highlights the delay lines both for the confidence-weighted input data values $q_k := x_k \cdot c_k$ and the confidence values $c_k$. Here, the adaptivity is contained in the filter blocks' input signals. Still, the implementation is equivalent to a single FIR filter with adaptive filter coefficients $w_i(k)$.

Figure 6:
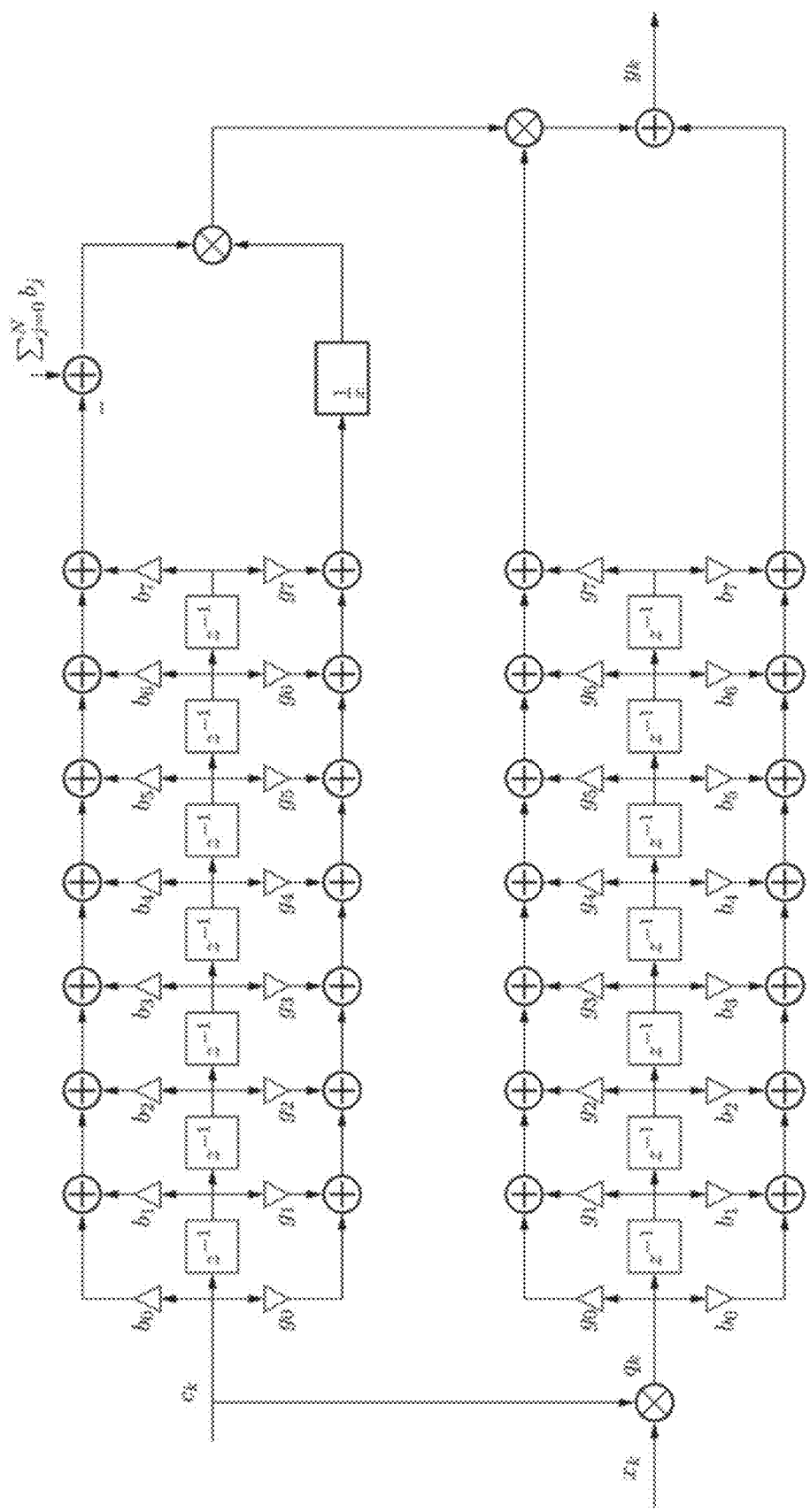
FIG. 6 shows an exemplary shift register implementation of a digital filter with confidence input.

A characteristic property of the tapped delay line implementation of the FIR filter in FIG. 6 is that the tapped delay lines for the confidence values TDL-C and the tapped delay line for confidence-weighted input data TDL-XC are identical, i.e. they have the same number of delay stages, and the same tap weights $b_0, b_1, \ldots$ and $g_0, g_1 \ldots$ are connected to the respective delay stages. Of course, one or the other delay line may be simplified depending on the input variable type, e.g. binary confidence input. Also, when $g_0 = g_1 = g_2 = \ldots$, the delay lines or associated computation blocks can be simplified. Further, it does not matter if the weights $b_0, b_1, \ldots$ in TDL-C differ from the weights $b_0, b_1, \ldots$ in TDL-XC by a constant factor, neither if the weights $g_0, g_1, \ldots$ in TDL-C differ from the weights $g_0, g_1, \ldots$ in TDL-XC by a constant factor, because such factors can be compensated for outside the tapped delay lines.

For example, if $g_i = 1/8$, the respective tap weights can also be set to 1, hence saving multiplications, and only the sum at the end of the tapped delay line before the (1/x) block is divided by 8, which can also be done by means of bit shift operations.

For binary confidence input, or confidence values from a finite set of values, the computation of the confidence-weighted input data values $q_k$ realized by the multiplication in FIG. 6 can also be realized by conditional statements, e.g. IF/ELSE or SWITCH statements, where for example $q_k$ is set to 0 if $c_k = 0$, and $q_k$ is set to 1 if $c_k = 1$. Instead of before the delay line, conditional statements can also be allocated at each tap of the delay line: A tap-weighted input value $b_i \cdot x_{k-i}$ or $g_i \cdot x_{k-i}$ is then only added to the respective delay line's output sum value if the associated $c_{k-i}$ is One. In this case, the samples $x_k$ can be directly input to TDL-XC and to not need to be multiplied with $c_k$ beforehand. The analog holds for TDL-C.

The order of the filters with impulse responses b and g do not necessarily have to be equal. Without loss of generality the filters are defined to have equal order N, where N is at least as large as the maximum of the orders of the filters with b and g, and unused coefficients are assumed to be zero-valued.

Choosing g=b is yielding another, non-preferred approach for redistributing erased coefficient weights. The non-erased filter coefficients are scaled by the same factor, which is re-computed at each discrete time instance k, i.e.

$$v_i(k) := c_{k-i} \cdot b_i \cdot \frac{1}{\sum_{j=0}^{N} c_{k-j} \cdot b_j}$$

3. Exception Handling

With the denominators in (1.2) or (1.3) it is apparent that an output value cannot be computed if the latest N+1 input samples all come along with Zero confidence. A possible exception for such a case is to repeat the latest valid output sample, or the exception can be forwarded to subsequent processing stages.

4. Windowing & DC Value Computation, in Particular for Signals with Two or More Expected Signal Levels For a symmetric filter or 'windowing' function b, taking a snapshot in time of the convolution of the input signal with the function b is equivalent to weighting the input samples with b and summing over the pointwise products. Hence, when interested in the DC value of a windowed signal, above concepts can equally be applied. A major difference between windowing with DC-computation and continuous filtering is that for the former typically each input sample contributes to only a single output value, i.e. it is a one-time processing—or block-wise—processing of input samples.

Figure 12:
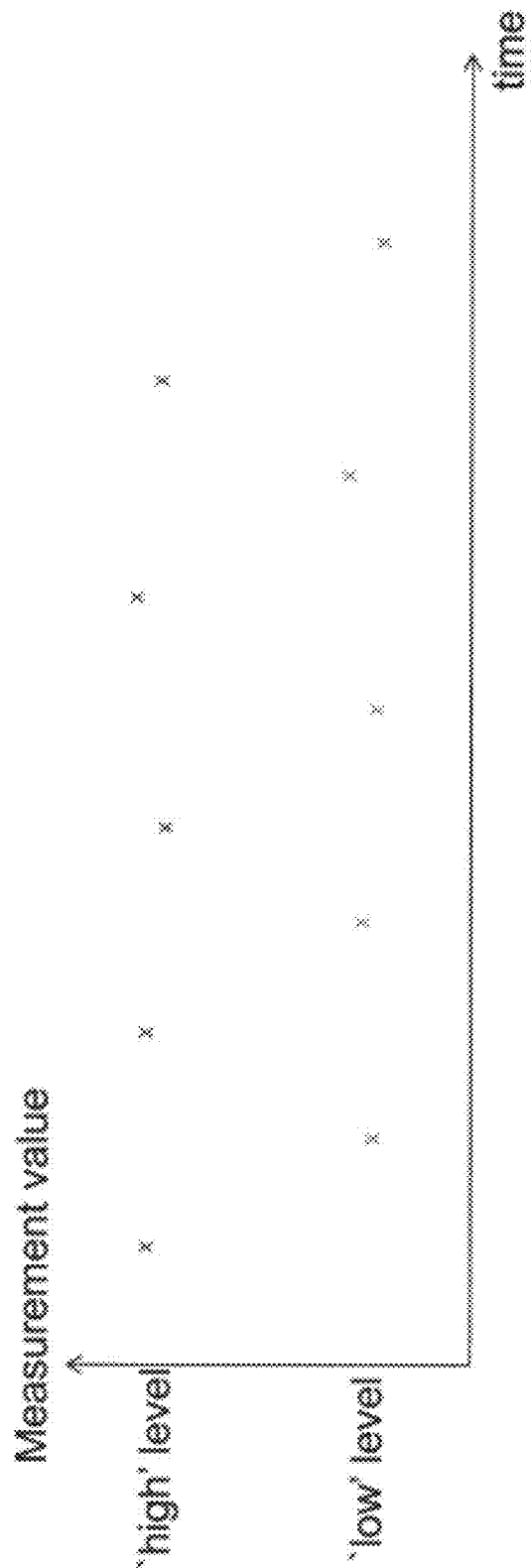
FIG. 12 shows an example of a two level measurement.

In many applications, the measurement signal is alternating between two distinct levels, typically with additional noise. We refer to these levels as 'high' and 'low' signal level. FIG. 12 shows exemplary measurement values with such high and low levels. An example is amplitude modulation (AM) with synchronous sampling of the analog received signal at twice the carrier frequency, where the information is contained in the difference between the 'high' and 'low' signal level. This method is applied, for example, in capacitive touch detection systems, or GestIC® Technology. The measurement (or 'received') signal of such an AM sensor system can, for example, be demodulated by alternatingly multiplying it with +1 and −1, and then low-pass filtered in order to estimate the DC (zero-frequency) value—the actual information, the 'averaged' difference between the 'high' and 'low' samples.

Such a signal with two levels will now be considered, which in a standard application is input to a low-pass filter, wherein the nomenclature of 'high' and 'low' samples is kept denoting the set of samples corresponding to either of the two distinct signal levels. A deviation from their respective signal level will be assumed to be caused by noise.

When a 'low' sample is detected to be useless, e.g. due to detected peak noise, we would like to set the weight of its corresponding coefficient in the filter to Zero, and re-distribute the erased weight onto other coefficients. However, in order to maintain the filter output's expected value, the re-distribution must only be onto the coefficients assigned to the other 'low' samples. Else, the filter output would be closer to the 'high' level than it should be, as coefficients assigned to 'high' samples would get additional weight.

In general, an input signal's samples must be sorted into sets of samples with the same expected value, and the digital filtering with confidence input—i.e. the re-distribution of coefficient weight—must happen in such a way that the all-over weight of the coefficients assigned to each set remains constant, which is most easily accomplished when re-distributing weight erased in one set within the same set.

Figure 7A:
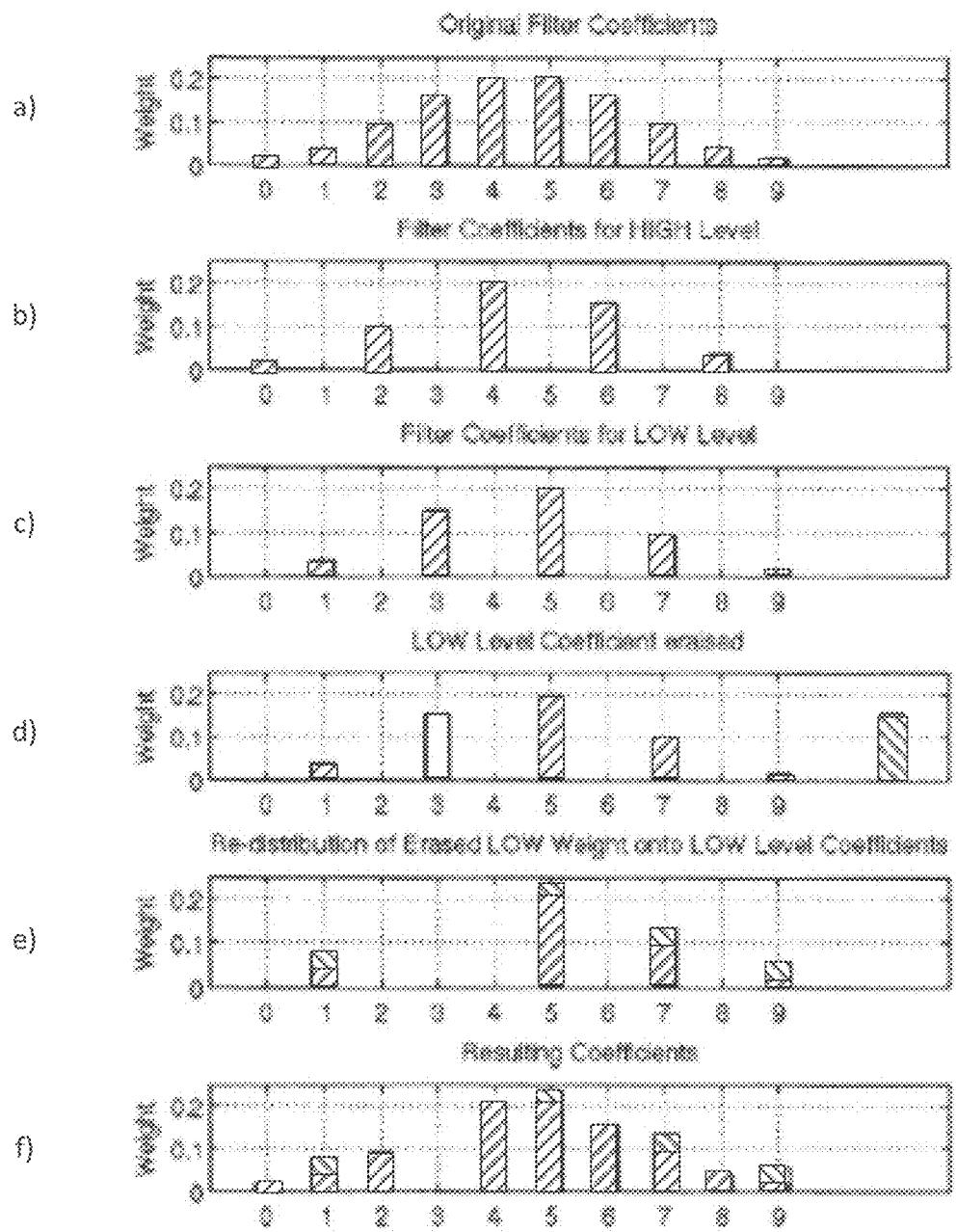
FIG. 7A shows another example of redistribution of erased coefficient weight according to various embodiments for two level signals.

FIG. 7A shows an example windowing and DC computation for signals with two levels. Handling of erased values is performed individually for samples at 'high' and 'low' signal level, respectively as shown in FIG. 7A. Every other filter coefficient is assigned to a measurement value from the 'high' or the 'low' signal level. Graph a) in FIG. 7A shows the original filter coefficients. Graph b) separates the 'high' level coefficients and graph c) the 'low' level coefficients. Graph d) in FIG. 7A shows that coefficient 3 corresponds to a sample at 'low' signal level and is erased. Its weight is re-distributed onto the other coefficients assigned to samples with a 'low' signal level. Graph e) shows the redistribution with respect to the 'low' signal level coefficients. The bottom graph f) shows a combination of the redistributed 'low' signal level coefficients and the 'high' signal level coefficients. The expected output value is thus preserved. This method can be implemented with two data branches, one for samples with 'high' signal level and one for samples with 'low' signal level, summing the branches' outputs in the end. Again, as this is a time-variant filter, the re-distribution of filter coefficients is updated for each output sample.

5. Confidence Output

The ability to process input confidence values immediately raises the question if also a confidence value can be provided for each output sample. Such an output confidence measure should be independent of the input sample values, but should be a function only of the input confidence values and the filter coefficients, i.e. (1.4) $d_k = f(b_0, b_1, \ldots, b_N, c_k, c_{k-1}, \ldots, c_{k-M})$ for a positive integer M.

A measure that fulfills (1.4) and is readily available is the sum of the filter coefficients being weighted with their corresponding input confidence values, i.e.

$$d_k = \sum_{i=0}^{N} c_{k-i} \cdot b_i,$$

for which also holds $d_k \in [0, 1]$ provided that $b_i \geq 0$ for all i and $\Sigma_{i=0}^{N} b_i = 1$, and in particular $d_k = 1$ when all input samples have full confidence, and $d_k = 0$ when all input confidence values are $c_{k-i} = 0$.

Making use of such confidence output, multiple of the proposed filters can be cascaded. Also, this output can be used for high-level control, e.g. 'do not trigger touch event if output confidence is too low'.

7. Design Rules

The proposed approach is applicable to any low-pass FIR filter. However, all filter coefficients should have the same sign, e.g. be positive valued. Principally, the requirement of a constant DC filter gain can also be fulfilled when (some of the) tap weights are negative valued. However, this would introduce the risk of yielding undesired filter characteristics, e.g. high-pass characteristics, for some confidence input constellations.

Further, the more similar the filter coefficients values are, the less critical when the input samples assigned to coefficients with large values are erased. In particular, the coefficients of a Rectangular window, Triangular window, Hamming and Hann window are in compliance with these rules.

Apart from the choice of the original filter coefficients and the exception handling, there are no further parameters to consider.

Figure 10:
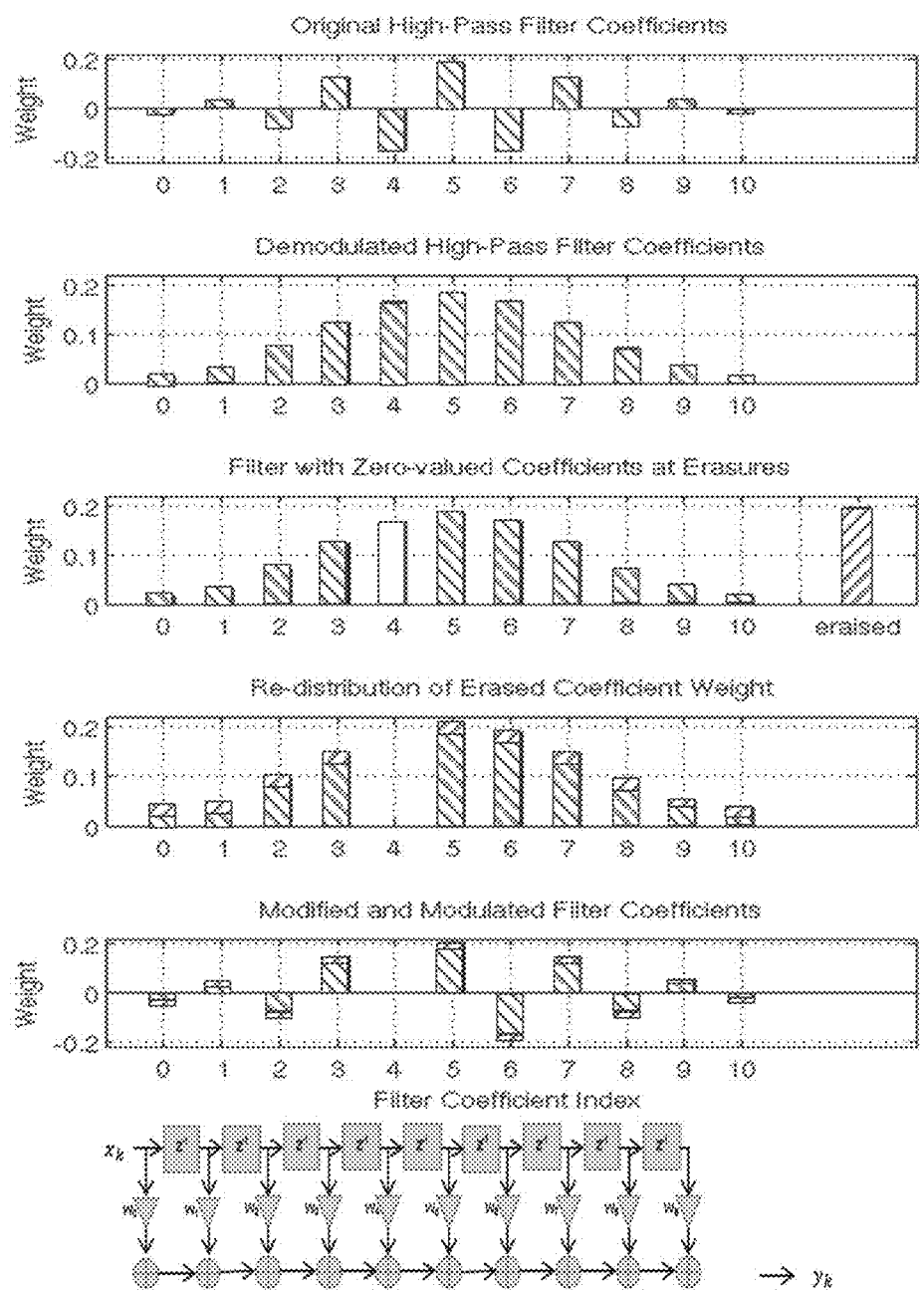
FIG. 10 shows an example of a redistribution of erased coefficient weight in a high pass filter embodiment.

The approach can be extended to high-pass filters. FIG. 10 shows an example of a high-pass filter whose original filter coefficient weights alternate between positive and negative sign as shown in the first plot from the top. Thus, according to an embodiment, first the high pass filter coefficients are demodulated using and alternating sign as shown in the second plot from the top. Then, the same method as with the low pass filter shown in FIG. 2 is applied as shown in the third and fourth plot from the top. The modified weights as shown in the fourth plot from the top are then re-modulated using the inverse alternating signs. This results in distributed weights as shown in the fifth plot from the top. Instead of remodulation of the filter coefficients, the filter's input signal can be demodulated, too, and filtered with the equivalent low-pass with coefficients according to the forth plot from the top, before modulating the signal again. No matter if the input signal is filtered with the high-pass filter directly, or demodulated and being filtered with the equivalent low-pass filter, it is important that the samples of the high pass filter's input signal—if it would be demodulated—would have a single expected value.

8. Applications & Use-Cases

As mentioned above, the proposed concept is applicable to any filtering system where the input signal is sampled faster than the actual information changes—the higher the sampling rate, the better. Among many others, such systems include 3D capacitive sensor systems, such as Assignees GestIC system and 1D/2D capacitive touch solutions. The filtering method may further more be applied to other sensor signals and is not restricted to capacitive sensor systems.

9. Properties

When initializing the filter with arbitrary, but zero-confidence, data, it provides an estimate of the input signal from turn-on time. Hence, the filter does not show the typical step response when filtering a signal with a non-zero mean and the filter conditions have been initialized with zeroes.

Numerical Example

In the following we give a numerical example for the computation of output values for the filter with confidence input. The tables below state the input sample values $x_k$ and the associated confidence values $c_k$ at time k, and the coefficients $b_i$ of the original filter function b. Here, g is a constant, i.e. erased coefficient weight will be redistributed uniformly.

| | k | | | | | | | | | | | | | | | | | |
|---|---|---|---|---|---|---|---|---|---|---|---|---|---|---|---|---|---|---|
| | −7 | −6 | −5 | −4 | −3 | −2 | −1 | 0 | 1 | 2 | 3 | 4 | 5 | 6 | 7 | 8 | 9 | 10 |
| $x_k$ | 0 | 0 | 0 | 0 | 0 | 0 | 0 | 7 | 6 | 8 | 9 | 6 | 21 | 6 | 7 | 33 | 8 | 6 |
| $c_k$ | 0 | 0 | 0 | 0 | 0 | 0 | 0 | 1 | 1 | 1 | 1 | 1 | 0 | 1 | 1 | 0 | 1 | 1 |

| | i | | | | | | | |
|---|---|---|---|---|---|---|---|---|
| | 0 | 1 | 2 | 3 | 4 | 5 | 6 | 7 |
| $b_i$ | 0.0207 | 0.0656 | 0.1664 | 0.2473 | 0.2473 | 0.1664 | 0.0656 | 0.0207 |
| $g_i$ | 0.125 | 0.125 | 0.125 | 0.125 | 0.125 | 0.125 | 0.125 | 0.125 |

At times k=5 and k=8 there are Erasures, i.e. $c_5 = c_8 = 0$. For example, the confidence has been set to zero here because the values $x_5$ and $x_8$ have been detected to be noise peaks.

For initialization of the filter, all confidence information within the filter's memory is set to zero before inputting the first sample-confidence pair $(x_0, c_0)$, e.g. by inputting N samples with zero confidence. This is indicated in the table by $c_k=0$ for k<0. At time k=0 the sample $x_0=7$ with confidence $c_0=1$ is input to the filter. According to above equations, the modified coefficients $b_i'(k=0)$ and the coefficients $w_i(k=0)$ compute as

| | i | | | | | | | |
|---|---|---|---|---|---|---|---|---|
| | 0 | 1 | 2 | 3 | 4 | 5 | 6 | 7 |
| $b_i'(0)$ | 0.0207 | 0 | 0 | 0 | 0 | 0 | 0 | 0 |
| $w_i(0)$ | 1 | 0 | 0 | 0 | 0 | 0 | 0 | 0 |

That is, $x_0=7$ is directly forwarded to the output, i.e. $y_0=x_0=7$.

At time k=9, when two Erasures, $x_5$ and $x_8$, are in the filter's buffer, $b_i'(k=9)$ and $w_i(k=9)$ compute as

| | i | | | | | | | |
|---|---|---|---|---|---|---|---|---|
| | 0 | 1 | 2 | 3 | 4 | 5 | 6 | 7 |
| $b_i'(9)$ | 0.0207 | 0 | 0.1664 | 0.2473 | 0 | 0.1664 | 0.0656 | 0.0207 |
| $w_i(9)$ | 0.0624 | 0 | 0.2081 | 0.2889 | 0 | 0.2081 | 0.1073 | 0.0624 |

FIG. 13 to FIG. 17 show yet other implementations of an Erasure Filter for packet data processing. These embodiments use a different, yet very memory efficient solution.

In packet data processing each input sample is contributing only to a single output value, and hence the implementation can be done using accumulators acc01 . . . acc04 instead of tapped delay lines (buffers)—as shown in the embodiments according to FIGS. 13-17. For each new data packet, according to some embodiments, these accumulators are set to Zero, and then the respective input values are successively added to them.

Moreover, intermediate versions with shorter delay lines than in other embodiments, plus accumulators, are also possible when the output data rate is lower than the input data rate by some decimation factor.

In the following, we denote as L the length of a data packet, and as N the order of a low-pass filter, where N=L−1. Let $x_k$, k=0, 1, . . . , L−1 denote the L samples of a data packet of length L. To each such sample is associated a binary confidence value $c_k \in [0,1]$, i.e. $0 \le c_k \le 1$, where $c_k=0$ means that $x_k$ is considered—e.g. by an peak noise or outlier detector—to not carry any useful information and shall not contribute to the filter output, and $c_k=1$ means that $x_k$ shall fully contribute to the filter output.

Figure 13:
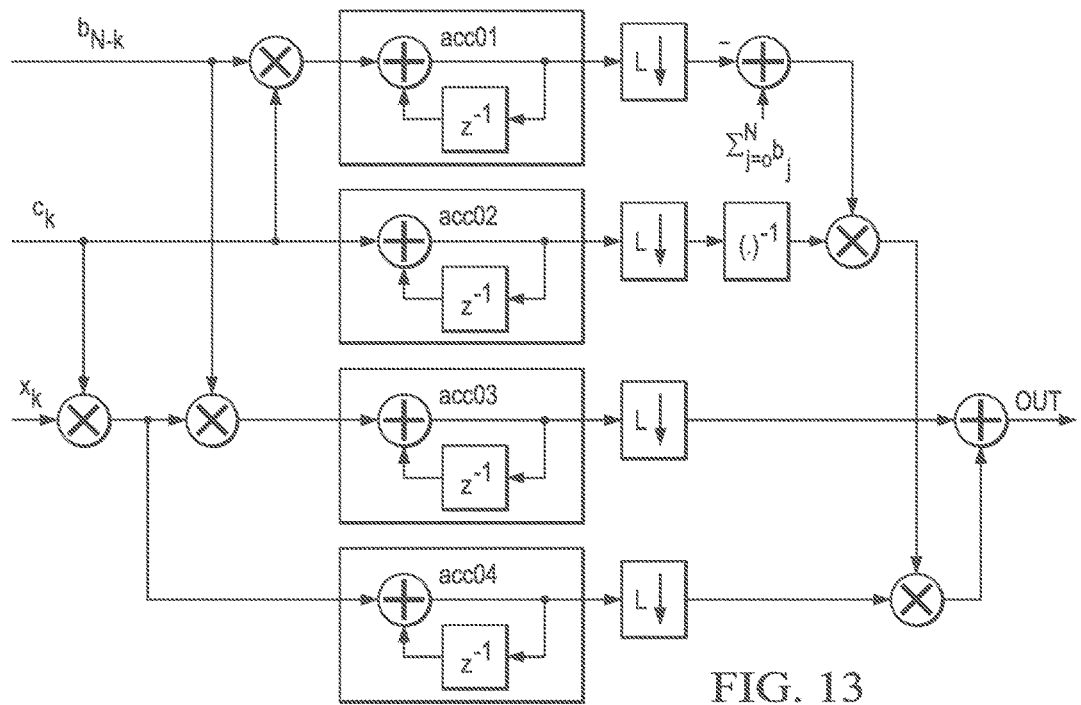
FIG. 13 shows an implementation for packet data processing with minimum buffer requirements.

FIG. 13 shows an implementation for Packet Data Processing with Minimum Buffer Requirements, in other words without any lengthy buffers, and only four accumulators acc01, acc02, acc03 and acc04. For each data packet of length L to be processed, the L input samples $x_k$, k=0, 1, . . . , L−1 are fed into the filter together with their associated confidence $c_k$. The corresponding filter coefficients $b_k$ can be stored in flash. According to some embodiments, after each data packet, the accumulators acc0x need to be reset to zero. Note that the operations to the right of the decimation blocks denoted by box "L↓," are only to be updated once for each data packet. Thus, the boxes "L↓," are merely forming a gate that forwards the accumulator value at its input to its output once the accumulator accumulated all input values of a packet having the length L. Thus, after accumulating L values the box "L↓," will output the accumulated value. FIG. 13 also includes the multiplicative inversion denoted by $(.)^{-1}$—i.e., the block's output value is 1 divided by the input value.

For symmetric filter impulse response where $b_{N-k}=b_k$ for k=0, 1, . . . , N, $b_{N-k}$ in FIG. 13 can also be replaced by $b_k$.

Figure 14:
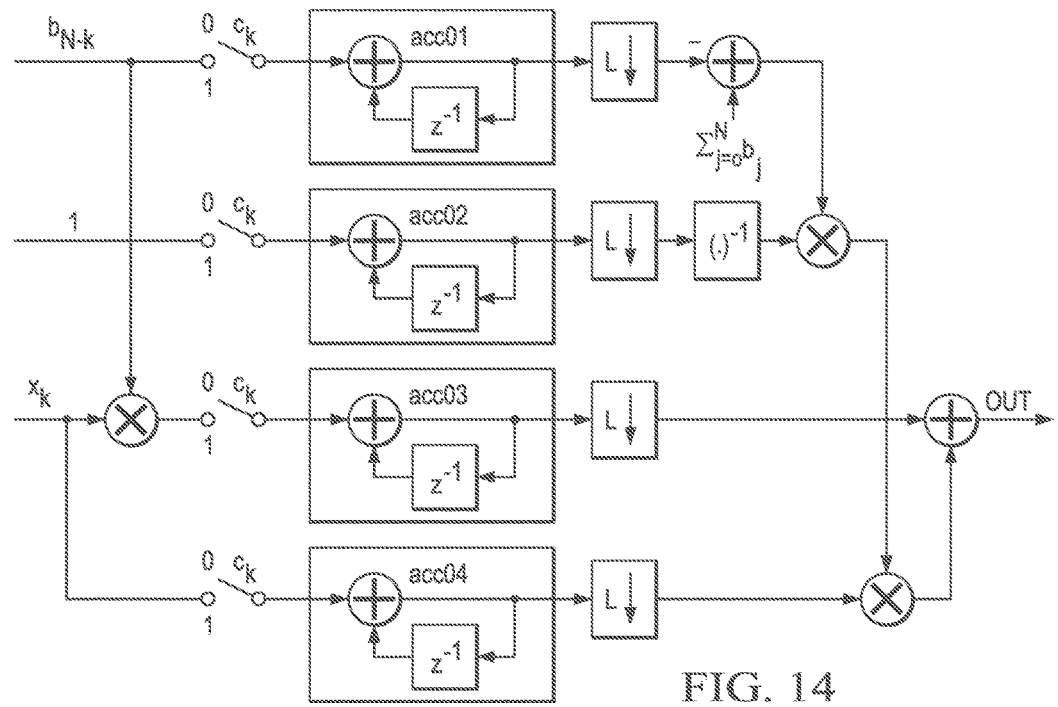
FIG. 14 show an implementation similar to FIG. 13, but multiplications with binary confidence ck=0,1 implemented with switches.

For binary confidence input with $c_k \in \{0,1\}$, the multiplications with $c_k$—i.e. the weighting with the confidence values—can also be implemented with switches, cf. FIG. 14—or a conditional increment of a variable.

According to other embodiments, if the accumulators are not reset after each packet L, which may not be the typical use-case, the filter is no longer an FIR filter but can be an IIR filter.

Particularly "confidence-weighted" data does refer to both to multiplying the data with confidence values, and also to opening or closing a data path with a switch. Analog, "weighting" and "weighted" refers to "multiplying" or "multiplied", respectively, whereas the multiplication can also happen by switching on or off a data path.

An actual example is shown below with a pseudo-code software implementation for a symmetric filter impulse response and binary confidence values, computation of output out for one data packet with samples x_k and associated confidence values c_k, and filter coefficients b_k according to FIG. 14.

```
float acc01=0;
uint16 acc02=0;
float acc03=0;
float acc04=0;
float aux = 0; for (k=0:N) aux+= b_k; // constant
for k=0:N
   if (c_k==1) {
       acc01 += b_k;
       acc02++;
       acc03 += b_k*x_k;
       acc04 += x_k;
   }
}
float out = (aux−acc01) * (1/acc02) * acc04 + acc03;
```

Figure 15:
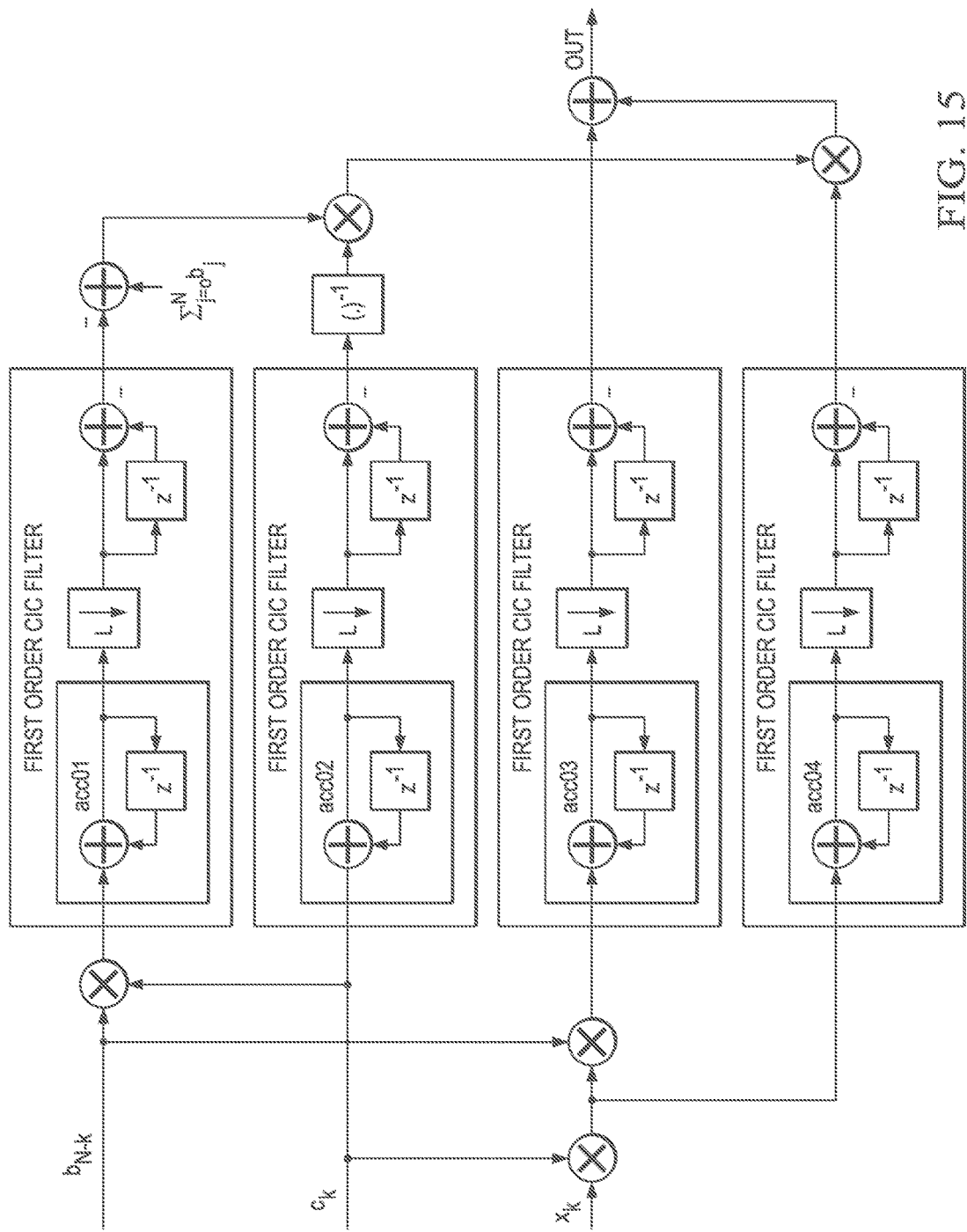
FIG. 15 shows an implementation similar to FIG. 13, but with a differential stage after decimation.
Figure 16:
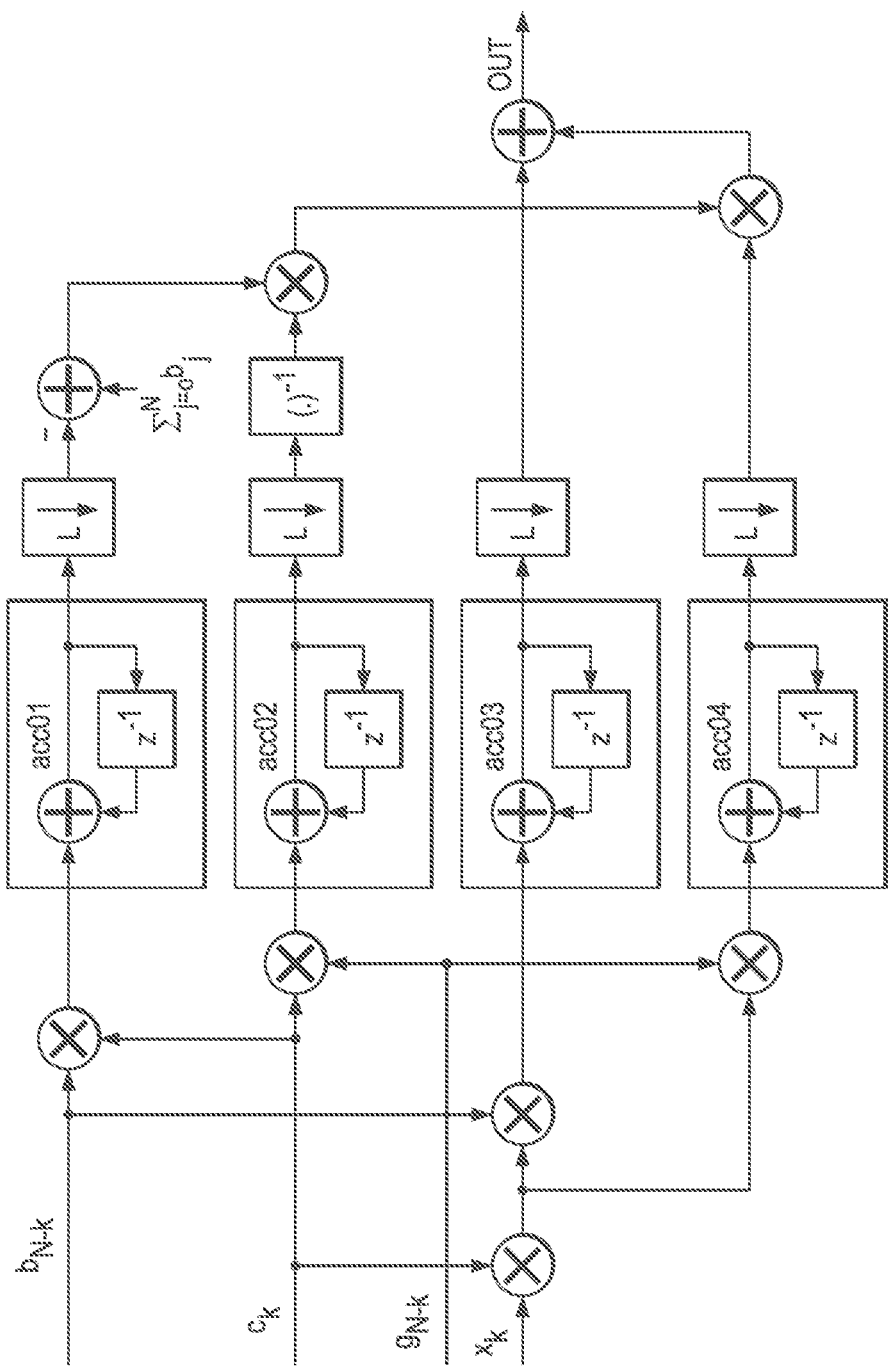
FIG. 16 shows an implementation similar to FIG. 13, but with a general redistribution function.
Figure 17:
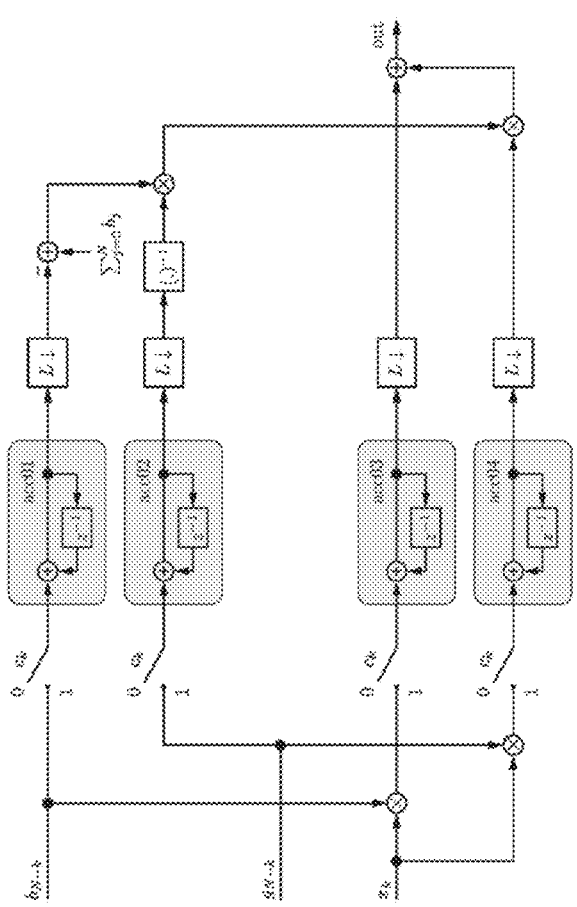
FIG. 17 shows an implementation with a general redistribution function, and a binary confidence input realized with switches.

Instead of employing the accumulators acc01, acc02, acc03 and acc04, which need to be reset to Zero after having input L samples and having computed the final output value, the sum over the L input values can also be done by remembering the values of acc01, acc02, acc03 and acc04 before inputting the data for the current packet, and to subtract these remembered values from the respective values of acc01, acc02, acc03 and acc04 after inputting the data for the current packet. This can, for example, be realized by employing a first order CIC filter as for example known from "An Economical Class of Digital Filters for Decimation and Interpolation", by Eugene B. Hogenauer, published in IEEE Transactions on Acoustics, Speech, and Signal Processing, Vol. ASSP-29, No. 2, April 1981, pages 155-162;—which is a moving-sum filter with decimation. This is shown in FIG. 15 where after accumulator and the decimation stage there is an additional differential stage subtracting the previous accumulated and decimated value from the current one.

General Re-Distribution Function

As for continuous data processing, also for packet data processing a general re-distribution function g can be employed. FIGS. 13 and 14 then change to FIG. 16 and FIG. 17, respectively.

Sample Values with Multiple Expected Values

In many applications, e.g. capacitive sensing, the actual information is amplitude modulated, and the ADC output data needs to be demodulated prior to low-pass filtering, and both the ADC output values and the demodulated ADC output values have two expected values. However, the Digital Filter with Confidence Input can only be directly applied to input samples with a single expected value. Hence, the demodulated ADC output values need to be split into two sets with a single expected value for all samples within each set.

Typically, the ADC alternatingly outputs samples at two different expected signal levels, denoted as Low and High samples, respectively, and we assign even time indices k to Low samples, and odd time indices to High samples.

We assume a symmetric filter impulse response, i.e. $b_i = b_{N-i}$, i=0, 1, 2, . . . N. We introduce $x_k^{(L)} = x_{2k}$ and $x_k^{(H)} = x_{2k+1}$, and likewise for the filter coefficients $b_i^{(e)} = b_{2i}$ and $b_i^{(o)} = b_{2i+1}$.

The original low-pass filter impulse response is split into two by separating coefficients $b_i$ with even i and odd i. This is shown in FIG. 18 for the example of the original filter impulse response being a Hamming window of length L=16.

Figure 18:
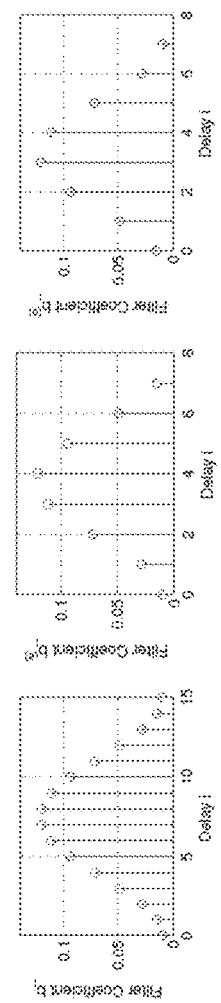
FIG. 18 shows the splitting of original filter impulse response into two.
Figure 19:
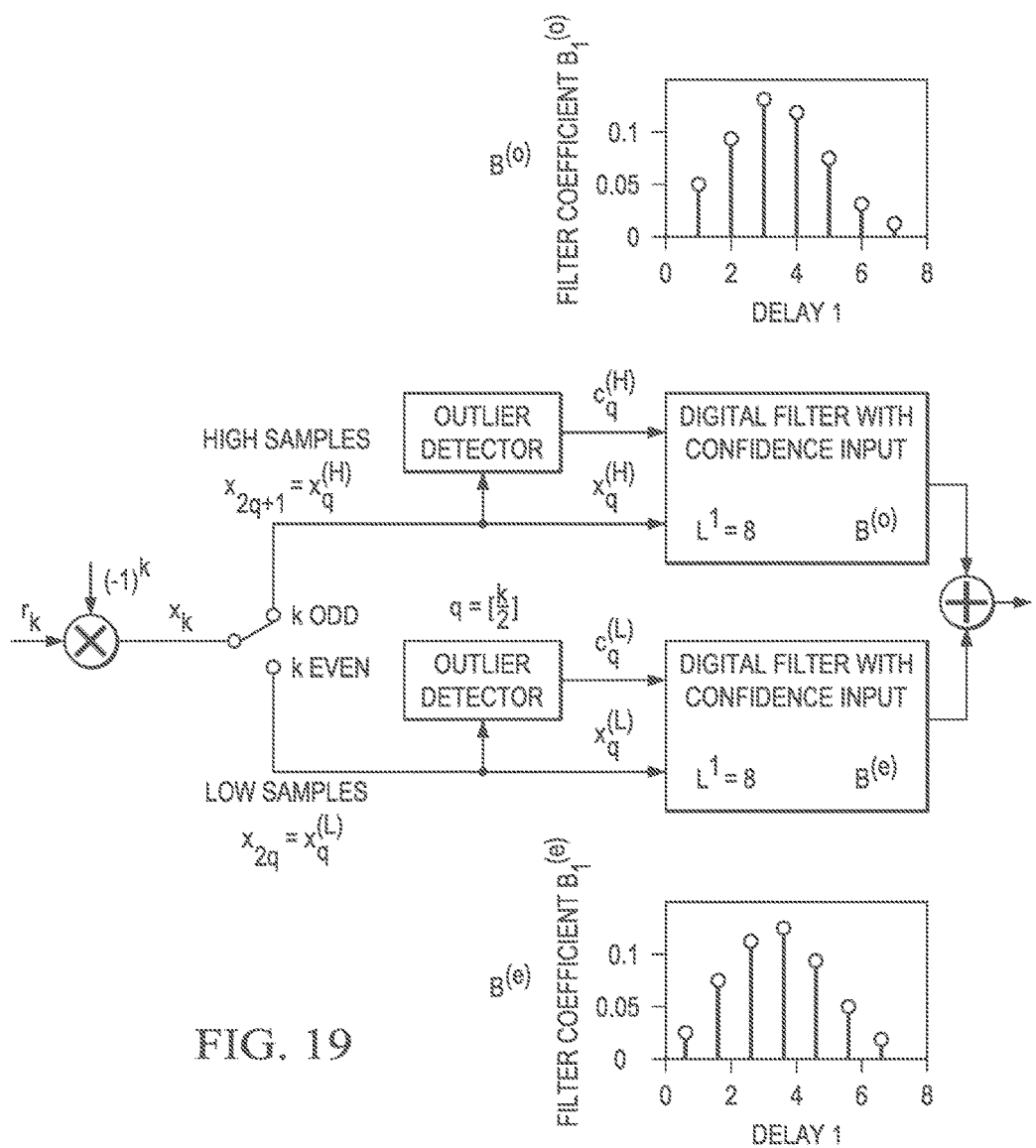
FIG. 19 shows an implementation using two filters with confidence input for amplitude modulated ADC output samples $r_k$.

Using these example filter impulse responses, FIG. 19 shows how the demodulated samples $x_k$ are distinguished for even and odd values of k and split onto two data branches, and with q being the floor value of k/2, two instances of the Digital Filter with Confidence Input according to FIG. 13—but with differing filter impulse responses, cf. FIGS. 18 and 19—are employed to process samples $x_k$ with even and odd indices k, respectively. Each data branch in this example has its own peak noise detector generating the confidence values c. The sample rate on each branch is half the input sample rate, and the packet length to be considered on each branch is half the packet length of input samples $x_k$, for example here the original packet length is L=16, and the packet length for each Digital Filter with Confidence Input is L'=L/2=8. The outputs of both filters are added to yield the final result.

The above mentioned digital filters can be formed by hardware, for example a programmable logic device or software, for example in a microcontroller, processor or digital signal processor.

BIBLIOGRAPHY

B. Boashash, M. M. (2004). Signal Enhancement by Time-Frequency Peak Filtering. *IEEE Transactions on Signals Processing*, 929-937.

Blahut, R. E. (1983). Theory and Practice of Error Control Codes. Reading, Mass.: Addison-Wesley.

Bossert, M. (1999). Channel Coding for Telecommunication. New York, N.Y., USA: John Wiley & Sons, Inc.

Commission, I. E. (n.d.). Electrical Fast Transient/Burst Immunity Test (IEC 61000-4-4).

Grubbs, F. E. (1950, March). Sample criteria for testing outlying observations. *Ann. Math. Statist., pp.* 27-58.

H. Hwang, R. H. (1995). Adaptive median filters: New algorithms and results. *IEEE Transactions on Image Processing*, 499-502.

Hampel, F. R. (1974). The influence curve and its role in robust estiamteion. *Journal of the American Statistical Association*, 69, 383-393.

J. Horentrup, M. S. (2014). Confidence-aware guided image filter. *IEEE International Conference on Image Processing*, (pp. 3243-3247).

K. Aiswarya, V. J. (2010). A new and efficient algorithm for the removal of high density salt and pepper noise in images and videos. *Second International Conference on Computer Modeling and Simulation*, (pp. 409-413).

Kalman, R. E. (1960). A new approach to linear filtering and prediction problems. Transactions of the *ASME-Journal of Basic Engineering*, 35-45.

Lee, J.-S. (1983). Digital image smoothing and the sigma filter. *Computer Vision, Graphics, and Image Processing*, 255-269.

*Microchip Touch and Input Sensing Solutions.* (n.d.). Retrieved from http://www.microchip.com/touchandinputsensing S.-J. Ko, Y. H. (1991). Center weighted median filters and their applications to image enhancement. *IEEE Transactions on Circuits and Systems*, 984-993.

T. Benazir, B. I. (2013). Removal of high and low density impulse noise from digital images using non linear filter. *International Conference on Signal Processing, Image Processing and Pattern Recognition*, (pp. 229-233).

The invention claimed is:

1. A digital filter comprising an assigned filter function with assigned filter coefficients, an input receiving input samples, another input receiving confidence values, and an output,
   wherein each input sample value is associated to an input confidence value and wherein each input sample is weighted with its associated confidence value;
   the filter output depends on both the input samples and the input confidence values, and
   wherein the filter comprises accumulators configured to accumulate a predefined number of the confidence weighted input samples, the associated confidence values, the confidence values weighted with assigned filter coefficients, and the confidence weighted input samples further weighted with the assigned filter coefficients.

2. The filter according to claim 1, comprising:
   a first branch having a first accumulator receiving the input confidence values weighted with coefficients from a coefficient set and generating a first accumulated value;
   a second branch having a second accumulator receiving the input confidence values and generating a second accumulated value;
   a third branch having a third accumulator receiving input sample values weighted with coefficients from the coefficient set and the input confidence values and generating a third accumulated value;
   a fourth branch having a fourth accumulator receiving the confidence weighted input values and generating a fourth accumulated value.

3. The filter according to claim 2, wherein the first accumulated value is subtracted from a constant value, wherein a result of the subtraction is being divided by the second accumulated value and multiplied with the fourth accumulated value, and added to the third accumulated value, and wherein the first, second, third, and fourth accumulator are subsequently cleared.

4. The filter according to claim 1, wherein multiple instances of the filter are operated in parallel, each instance on a subset of input samples and associated confidence values, and with dedicated coefficients.

5. The filter according claim 4, wherein input samples are alternatingly assigned to one of two instances of the filter.

6. The filter according to claim 1, wherein a confidence value is represented by a digital logic value.

7. The filter according to claim 3, wherein the constant value is a sum of all coefficients.

8. The filter according to claim 1, wherein the assigned filter function is a low-pass filter function.

9. The Filter according to claim 8, wherein the low-pass has been obtained from transforming a high-pass or band-pass to an equivalent low-pass domain.

10. The filter according to claim 1, wherein the assigned filter function has only positive valued coefficients or only negative valued coefficients.

11. The filter according to claim 1, wherein the assigned filter function has at least one non-zero valued coefficient with a different magnitude than another non-zero coefficients.

12. The filter according to claim 1, wherein a digital filter's DC gain is constant or approximately constant.

13. The filter according to claim 1, wherein the filter is formed by software.

14. A digital filter comprising an assigned filter function with first and second filter coefficient sets, an input receiving input samples, another input receiving confidence values, and an output,
   wherein each input sample value is associated to an input confidence value;
   the filter output depends on both the input samples and the input confidence values, and
   wherein the digital filter comprises:
   a first branch having a first accumulator receiving the input confidence values weighted with coefficients from the first coefficient set and generating a first accumulated value;
   a second branch having a second accumulator receiving the input confidence values weighted with coefficients from the second coefficient set and generating a second accumulated value;
   a third branch having a third accumulator receiving input sample values weighted with coefficients from the first coefficient set and the input confidence values and generating a third accumulated value;
   a fourth branch having a fourth accumulator receiving the input values weighted with coefficients from the second coefficient set and the input confidence values and generating a fourth accumulated value.

15. The filter according to claim 14, wherein the first accumulated value is subtracted from a constant value, wherein a result of the subtraction is being divided by the second accumulated value and multiplied with the fourth accumulated value, and added to the third accumulated value, and wherein the first, second, third, and fourth accumulator are subsequently cleared.

16. The filter according to claim 15, wherein multiple instances of the filter are operated in parallel, each instance on a subset of input samples and associated confidence values, and with dedicated coefficients.

17. The filter according to claim 14, wherein a confidence value is represented by a digital logic value.

18. The filter according to claim 15, wherein the constant value is a sum of all coefficients.

19. The filter according to claim 14, wherein the assigned filter function is a low-pass filter function.

20. The Filter according to claim 19, wherein the low-pass has been obtained from transforming a high-pass or band-pass to an equivalent low-pass domain.

21. The filter according to claim 14, wherein the assigned filter function has only positive valued coefficients or only negative valued coefficients.

22. The filter according to claim 14, wherein the assigned filter function has at least one non-zero valued coefficient with a different magnitude than another non-zero coefficients.

23. The filter according to claim 14, wherein a digital filter's DC gain is constant or approximately constant.

24. A filter system, comprising:
   a first and second digital filter, each comprising an assigned filter function with assigned filter coefficients, an input receiving input samples, another input receiving confidence values, and an output, wherein each input sample value is associated to an input confidence value and wherein each input sample is weighted with its associated confidence value; wherein the filter output depends on both the input samples and the input confidence values, and wherein the filter comprises accumulators configured to accumulate the confidence weighted input samples, the associated confidence values, the confidence values weighted with assigned filter coefficients, and the confidence weighted input samples further weighted with the assigned filter coefficients; and a demultiplexer receiving an input signal and generating input samples for said first and second digital filter.

25. The filter system according to claim 24, further comprising:
a first outlier detector receiving said input samples for said first digital filter and generating associated confidence values; and
a second outlier detector receiving said input samples for said second digital filter and generating associated confidence values.

26. The filter system according to claim 24, wherein input samples for the first digital filter are high samples and input samples for the second digital filter are low samples.

27. A filter system, comprising:
a first and second digital filter, each comprising:
an assigned filter function with first and second filter coefficient sets, an input receiving input samples, another input receiving confidence values, and an output,
wherein each input sample value is associated to an input confidence value;
the filter output depends on both the input samples and the input confidence values, and
wherein each digital filter further comprises:
a first branch having a first accumulator receiving the input confidence values weighted with coefficients from the first coefficient set and generating a first accumulated value;
a second branch having a second accumulator receiving the input confidence values weighted with coefficients from the second coefficient set and generating a second accumulated value;
a third branch having a third accumulator receiving input sample values weighted with coefficients from the first coefficient set and the input confidence values and generating a third accumulated value;
a fourth branch having a fourth accumulator receiving the input values weighted with coefficients from the second coefficient set and the input confidence values and generating a fourth accumulated value; and
a demultiplexer receiving an input signal and generating input samples for said first and second digital filter.

28. The filter system according to claim 27, further comprising:
a first outlier detector receiving said input samples for said first digital filter and generating associated confidence values; and
a second outlier detector receiving said input samples for said second digital filter and generating associated confidence values.

29. The filter system according to claim 27, wherein input samples for the first digital filter are high samples and input samples for the second digital filter are low samples.

30. A digital filter comprising an assigned filter function with assigned filter coefficients, an input receiving input samples, another input receiving confidence values, and an output,
wherein each input sample value is associated to an input confidence value;
wherein the filter output depends on the input samples, the input confidence values as well as the filter coefficients;
wherein the filter contains multiple accumulators;
wherein an output sample is produced after a predetermined number of sample values and associated confidence values have been input to the filter.

31. A method for filtering digital input samples, comprising the steps of:
receiving digital input sample values and associated input confidence values;
accumulating the input confidence values weighted with coefficients from a coefficient set and generating a first accumulated value;
accumulating the input confidence values and generating a second accumulated value;
accumulating the input sample values weighted with coefficients from the coefficient set and the input confidence values and generating a third accumulated value;
accumulating the confidence weighted input values and generating a fourth accumulated value.

32. The method according to claim 31, further comprising:
Subtracting the first accumulated value from a constant value, wherein a result of the subtraction is being divided by the second accumulated value and multiplied with the fourth accumulated value, and added to the third accumulated value, and subsequently clearing the first, second, third, and fourth accumulator.

33. The method according to claim 32, wherein the constant value is a sum of all coefficients.

34. The method according to claim 31, wherein the input confidence value is binary.

35. A method for filtering digital input samples, comprising the steps of:
receiving digital input sample values and associated input confidence values;
accumulating the input confidence values weighted with coefficients from a first coefficient set and generating a first accumulated value;
accumulating the input confidence values weighted with coefficients from a second coefficient set and generating a second accumulated value;
accumulating input sample values weighted with coefficients from the first coefficient set and the input confidence values and generating a third accumulated value;
accumulating the input values weighted with coefficients from the second coefficient set and the input confidence values and generating a fourth accumulated value.

36. The method according to claim 35, further comprising subtracting the first accumulated value from a constant value, wherein a result of the subtraction is being divided by the second accumulated value and multiplied with the fourth accumulated value, and added to the third accumulated value, and subsequently clearing the first, second, third, and fourth accumulator.

37. The method according to claim 36, wherein the constant value is a sum of all coefficients.

38. The method according to claim 35, wherein the input confidence value is binary.

* * * * *